United States Patent
Donnal et al.

(10) Patent No.: US 11,262,386 B2
(45) Date of Patent: Mar. 1, 2022

(54) NON-INTRUSIVE MONITORING

(71) Applicant: Massachusetts Institute of Technology, Cambridge, MA (US)

(72) Inventors: John Sebastian Donnal, Cambridge, MA (US); James Paris, Boston, MA (US); Steven B. Leeb, Belmont, MA (US); David Lawrence, Somerville, MA (US)

(73) Assignee: Massachusetts Institute of Technology, Cambridge, MA (US)

( * ) Notice: Subject to any disclaimer, the term of this patent is extended or adjusted under 35 U.S.C. 154(b) by 134 days.

(21) Appl. No.: 15/767,635

(22) PCT Filed: Oct. 14, 2016

(86) PCT No.: PCT/US2016/057165
§ 371 (c)(1),
(2) Date: Apr. 11, 2018

(87) PCT Pub. No.: WO2017/066658
PCT Pub. Date: Apr. 20, 2017

(65) Prior Publication Data
US 2018/0306839 A1    Oct. 25, 2018

Related U.S. Application Data

(60) Provisional application No. 62/308,935, filed on Mar. 16, 2016, provisional application No. 62/242,618, filed on Oct. 16, 2015.

(51) Int. Cl.
*G01R 15/16* (2006.01)
*G01R 21/133* (2006.01)
(Continued)

(52) U.S. Cl.
CPC ......... *G01R 15/165* (2013.01); *G01R 21/133* (2013.01); *G01R 21/14* (2013.01); *G01R 29/085* (2013.01); *G01R 35/005* (2013.01)

(58) Field of Classification Search
CPC ..... G01R 15/16; G01R 15/165; G01R 21/133
See application file for complete search history.

(56) References Cited

U.S. PATENT DOCUMENTS 5,627,759 A * 5/1997 Bearden ............ H02J 13/00034
                                                    702/62
5,991,177 A    11/1999 Kaczkowski
(Continued)

FOREIGN PATENT DOCUMENTS

EP    2187225 A2 * 5/2010 ........... G01R 31/026
EP    2 857 848 A1    4/2015

OTHER PUBLICATIONS

EP 16856331.0, dated Aug. 1, 2019, Extended European Search Report.
(Continued)

*Primary Examiner* — Walter L Lindsay, Jr.
*Assistant Examiner* — Milton Gonzalez
(74) *Attorney, Agent, or Firm* — Wolf, Greenfield & Sacks, P.C.

(57) ABSTRACT

Methods and apparatus for non-intrusive monitoring by sensing physical parameters such as electric and/or magnetic fields. Such apparatus and techniques may find application in a variety of fields, such as monitoring consumption of electricity, for example.

13 Claims, 30 Drawing Sheets

(51) Int. Cl.
  *G01R 21/14* (2006.01)
  *G01R 29/08* (2006.01)
  *G01R 35/00* (2006.01)

(56) References Cited

U.S. PATENT DOCUMENTS

| | | | | |
|---|---|---|---|---|
| 6,429,785 | B1* | 8/2002 | Griffin | G01R 21/133 |
| | | | | 340/661 |
| 6,675,071 | B1* | 1/2004 | Griffin, Jr | G01R 19/2513 |
| | | | | 340/661 |
| 7,019,543 | B2* | 3/2006 | Quon | H01J 37/32082 |
| | | | | 324/713 |
| 2002/0065591 | A1 | 5/2002 | Schubert et al. | |
| 2004/0021454 | A1* | 2/2004 | Jevtic | G01R 1/06772 |
| | | | | 324/72.5 |
| 2006/0212502 | A1 | 9/2006 | Chatterjee | |
| 2006/0232264 | A1 | 10/2006 | Jurisch | |
| 2008/0243413 | A1 | 10/2008 | Kasztenny et al. | |
| 2010/0220422 | A1* | 9/2010 | Jackson | H02H 3/337 |
| | | | | 361/93.2 |
| 2011/0109306 | A1 | 5/2011 | Leeb et al. | |
| 2013/0096853 | A1 | 4/2013 | Mahalingam et al. | |
| 2014/0320125 | A1 | 10/2014 | Leeb et al. | |
| 2016/0084888 | A1* | 3/2016 | Busemann | G01R 15/16 |
| | | | | 324/126 |

OTHER PUBLICATIONS

International Search Report and Written Opinion for Applcation No. PCT/US2016/057165 dated Feb. 21, 2017.
International Preliminary Report on Patentability for Application No. PCT/US2016/057165 dated Apr. 26, 2018.
Extended European Search Report dated Aug. 1, 2019 in connection with European Application No. 16856331.0.
No Author Listed, How smart meters work, BGE. 2015:2 pages. http://www.bge.com/smartenergy/smartgrid/smartmeters/Pages/How-Smart-Meters-Work.aspx [Last accessed Jul. 26, 2021].
No Author Listed, WeMo insight switch. Belkin. 2015:7 pages. http://www.belkin.com/us/p/P-F7C029/ [Last accessed Jul. 26, 2021].
No Author Listed, Smart Plugs. D-Link. 2021:4 pages. https://us.dlink.com/en/consumer/smart-plugs [Last accessed Jul. 21, 2021].
No Author Listed, Attractive JavaScript plotting for jQuery. Flot. 2014:1 page. http://www.flotcharts.org/ [Last accessed Jul. 21, 2021].
No Author Listed, SmartMeter™ network. PG & E. 2021:5 pages. https://www.pge.com/en_US/residential/save-energy-money/analyze-your-usage/your-usage/view-and-share-your-data-with-smartmeter/smartmeter-network.page [Last accessed Jul. 21, 2021].
Althaher et al., Automated demand response from home energy management system under dynamic pricing and power and comfort constraints. IEEE Transactions on Smart Grid. Jul. 2015;6(4):1874-83.
Amirach et al., A new approach for event detection and feature extraction for NILM. 21st IEEE International Conference on Electronics, Circuits and Systems (ICECS). Dec. 7, 2014:287-90.
Balsamo et al., A new non-invasive voltage measurement method for wireless analysis of electrical parameters and power quality. Sensors, IEEE. Nov. 3, 2013:1-4.
Belhomme et al., The ADDRESS project: Developing Active Demand in smart power systems integrating renewables. IEEE Power and Energy Society General Meeting. Jul. 24, 2011:1-8.
Bobowski et al., Calibrated single-contact voltage sensor for high-voltage monitoring applications. IEEE Transactions on instrumentation and measurement. Oct. 14, 2014;64(4):923-34.
Chacon, Pro Git, 2nd ed. Apress, 2014:441 pages.
Dong et al., Non-intrusive signature extraction for major residential loads. IEEE Transactions on Smart Grid. Sep. 2013;4(3):1421-30.
Donnal et al., Noncontact power meter. IEEE Sensors Journal. Feb. 2014;15(2):1161-9.
Grant et al., An electrostatic charge meter using a microcontroller offers advanced features and easier ATEX certification. Journal of Electrostatics. May 1, 2009;67(2-3):473-6.
Krum et al., Pro Puppet. Apress; Dec. 9, 2013:318 pages.
Lawrence, Hardware and software architecture for non-contact, non-intrusive load monitoring (Doctoral dissertation, Massachusetts Institute of Technology). 2016;121 pages.
Lee et al., Assessment of Demand Response and Advanced Metering. Staff Report, Federal Energy Regulatory Commission. Dec. 2014:40 pages.
Lenz et al., Magnetic sensors and their applications. IEEE Sensors journal. Jun. 5, 2006;6(3):631-49.
Livengood et al., The energy box: Locally automated optimal control of residential electricity usage. Service Science. Mar. 2009;1(1):1-16.
Massie et al., Monitoring with Ganglia: tracking dynamic host and application metrics at scale. O'Reilly Media, Inc.; Nov. 9, 2012;254 pages.
Milioudis et al., Event detection for load disaggregation in smart metering. IEEE PES ISGT Europe. Oct. 6, 2013:1-5.
Pai et al., Non-intrusive electric power sensors for smart grid. SENSORS. IEEE Oct. 28, 2012:1-4.
Paris et al., Hunting cyclic energy wasters. IEEE Transactions on Smart Grid. Nov. 2014;5(6):2777-86.
Paris et al., NilmDB: The non-intrusive load monitor database. IEEE Transactions on Smart Grid. Sep. 2014;5(5):2459-67.
Paris et al., Scalability of non-intrusive load monitoring for shipboard applications. Naval Engineers Day 2009. National Harbor, Maryland, Apr. 2009; 1-11.
Rodríguez-Mondéjar et al., The ADDRESS energy box: Design and implementation. IEEE International Energy Conference and Exhibition (ENERGYCON) Sep. 9, 2012: 629-34.
Selva et al., Non-contact current measurement in power transmission lines. Procedia Technology. Jan. 1, 2015;21:498-506.
Shaw et al., Nonintrusive load monitoring and diagnostics in power systems. IEEE Transactions on Instrumentation and Measurement. Jul. 2008;57(7):1445-54.
Sweet, The smart meter avalanche. IEEE Spectrum. Oct. 2009; 2 pages.
Tsang et al., Dual capacitive sensors for non-contact AC voltage measurement. Sensors and Actuators A: Physical. Jun. 1, 2011;167(2):261-6.
Von Luxburg, A tutorial on spectral clustering. Statistics and computing. Dec. 2007;17(4):395-416.
Vosteen, A high speed electrostatic voltmeter technique. Conference Record of the 1988 IEEE Industry Applications Society Annual Meeting Oct. 2, 1988: 1617-19.
Wang et al., The application of NILM in energy evaluation of smart home: Contrast with IPv6. 2011 International Conference on Electric Information and Control Engineering Apr. 15, 2011: 4 pages.
Wichakool et al., Smart metering of variable power loads. IEEE Transactions on Smart Grid. Jan. 2014;6(1):189-98.
Wu et al., On-site voltage measurement with capacitive sensors on high voltage systems. IEEE Trondheim PowerTech. Jun. 19, 2011:1-6.
Zisman, A new method of measuring contact potential differences in metals. Review of Scientific Instruments. Jul. 1932;3(7):367-70.

* cited by examiner

Identify transients:

| Off | Exemplars | Left | Right | | |
|---|---|---|---|---|---|
| ○ | Laser On | ○ | ⊙ | Edit | Remove |
| ○ | Laser Off | ○ | ⊙ | Edit | Remove |
| ○ | Compressor On | | | | Remove |
| ○ | Compressor Off | | | | Remove |

FIG. 28

NON-INTRUSIVE MONITORING

CROSS-REFERENCE TO RELATED APPLICATIONS

This Application is a national stage application under 35 U.S.C. § 371 of International Patent Application Serial No. PCT/US2016/057165 filed on Oct. 14, 2016, entitled "NON-INTRUSIVE MONITORING", which claims priority under to U.S. Provisional Application Ser. No. 62/242,618, entitled "ENERGY APPS" filed on Oct. 16, 2015, and to U.S. Provisional Application Ser. No. 62/308,935, entitled "NONCONTACT POWER SENSING" filed on Mar. 16, 2016, each of which is herein incorporated by reference in its entirety.

BACKGROUND

1. Field of Invention

The apparatus and techniques described herein relate to non-intrusive monitoring by sensing physical parameters such as electric and/or magnetic fields to monitor and/or control electrical loads, for example. Such apparatus and techniques may find application in a variety of fields, such as monitoring consumption of electricity in homes or businesses, for example.

2. Discussion of the Related Art

Among the many potential benefits identified by the U.S. Department of Energy, the smart grid promises enormous energy savings through cost-effective demand-side energy management. Reducing the power consumed by utility customers by just 5% would equate to permanently eliminating the fuel and greenhouse gas emissions from 53 million cars. The accessibility of power monitoring information will be a critical driver for the success of these efforts. Centralized power monitoring systems promise lower sensor count than other per-load sensor systems. Several references describe centralized power monitoring approaches in which loads are identified and then monitored according to their current signatures. Closed or clamp core sensors wrapped around the utility feed are often used to provide current sense signals. These sensors are impractical in many retrofit applications. For instance, skilled labor is required to separate line and neutral in order to deploy a wrap-around sensor, and in some industrial environments electrical service interruption may be unacceptable or prohibitively expensive.

There are several patents describing non-contact power monitoring. EP0176634A1 describes a Hall Effect sensor for monitoring multiple conductor cables, but only for a two-wire conductor and for a specific wire rotation. Numerous patents describe a circuit breaker with integrated current monitoring (for example, U.S. Pat. No. 5,196,982), but all of the described techniques require replacement of the existing breaker. U.S. Pat. No. 6,330,516 describes magnetic sensors arrayed around a breaker panel but does not describe a signal processing technique that can be used to recover current and voltage information from these sensors or what type of sensors are actually used. It is unclear how the described system could be implemented in practice.

SUMMARY

An apparatus for non-intrusive power monitoring, the apparatus comprising: a capacitive pickup; circuitry for sensing a signal from the capacitive pickup; an analog to digital converter to digitize the signal; and a digital filter configured to integrate the digitized signal into a voltage measurement while rejecting low-frequency disturbances.

A method of non-intrusive power monitoring, the method comprising: sensing a signal from a capacitive pickup; digitizing the signal; and digitally filtering the digitized signal to integrate the digitized signal into a voltage measurement while rejecting low-frequency disturbances.

A method of non-intrusive power monitoring, the method comprising: sequentially applying a constant DC current or an AC current of constant amplitude to respective conductors of a plurality of conductors of a cable; obtaining calibration measurements from a plurality of magnetic field sensors positioned external to the cable while sequentially applying a constant current, a quantity of the plurality of magnetic field sensors being greater than or equal to a quantity of the plurality of cables; running a calibration algorithm to calculate calibration data based on the calibration measurements; obtaining monitoring measurements from the plurality of magnetic field sensors; and calculating currents through the plurality of conductors using the monitoring measurements and the calibration data.

A method of non-intrusive power monitoring, the method comprising: obtaining calibration measurements from a plurality of magnetic field sensors positioned external to the cable, a quantity of the plurality of magnetic field sensors being greater than or equal to a quantity of the plurality of cables; running a calibration algorithm to calculate calibration data based on the calibration measurements; obtaining monitoring measurements from the plurality of magnetic field sensors; and calculating currents through the plurality of conductors using the monitoring measurements and the calibration data.

An apparatus for non-intrusive power monitoring, the apparatus comprising: at least one processor configured to: obtain calibration measurements from a plurality of magnetic field sensors positioned external to the cable, a quantity of the plurality of magnetic field sensors being greater than or equal to a quantity of the plurality of cables; run a calibration algorithm to calculate calibration data based on the calibration measurements; obtain monitoring measurements from the plurality of magnetic field sensors; and calculate currents through the plurality of conductors using the monitoring measurements and the calibration data.

A computer readable medium having stored thereon instructions, which, when executed by a processor, perform any method described or claimed herein.

The foregoing summary is provided by way of illustration and is not intended to be limiting.

BRIEF DESCRIPTION OF DRAWINGS

In the drawings, each identical or nearly identical component that is illustrated in various figures is represented by a like reference character. For purposes of clarity, not every component may be labeled in every drawing. The drawings are not necessarily drawn to scale, with emphasis instead being placed on illustrating various aspects of the techniques and devices described herein.

FIG. 28 shows the power consumption of the shop during normal operation.

DETAILED DESCRIPTION

Described herein are methods and apparatus for non-intrusive monitoring that can be used in any of a variety of applications, such as monitoring consumption of a consumable such as electricity, for example. Such methods and apparatus advantageously may be used in retrofit applications whereby monitoring can be performed without modification of existing equipment. Non-intrusive monitoring may be performed by measuring physical parameters, such as electric fields and/or magnetic fields, produced by the equipment being monitored. For example, a sensor apparatus may be placed by an untrained user in a suitable position to measure a physical parameter (e.g., electric and/or magnetic field(s)) produced by existing installed equipment.

Some embodiments are capable of measuring current and/or voltage levels on a circuit breaker or the wires leading to/from the circuit breaker without modifying the circuit breaker or panel, and without making contact to the conductors or the wires leading to/from the circuit breaker, by detecting electric and/or magnetic field(s) external to the circuit breaker.

Figure 1A:
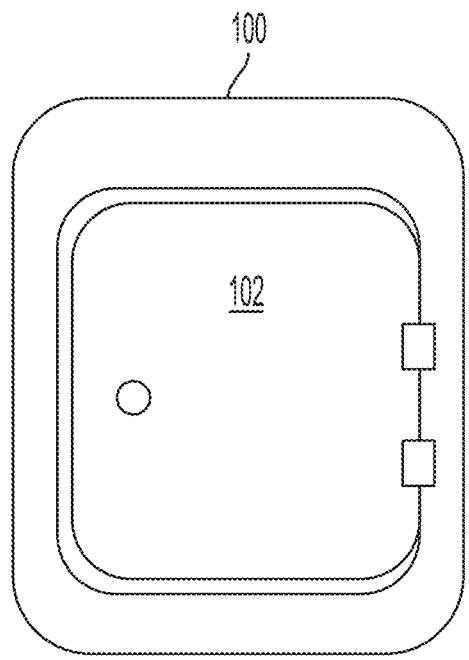
FIG. 1A shows a typical circuit breaker unit when the door is closed.
Figure 1B:
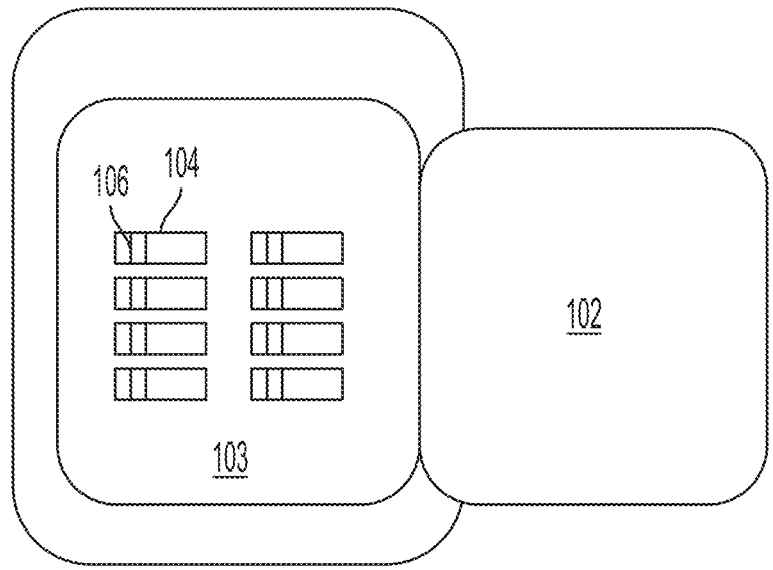
FIG. 1B shows the interior of the circuit breaker unit when the door is open, including a circuit breaker panel with a plurality of circuit breakers.

FIG. 1A shows a typical circuit breaker unit 100 of the type commonly used in homes and offices. Circuit breaker unit 100 has a door 102 that may be opened and closed by hand. The door 102 may be closed most of the time for safety reasons, as shown in FIG. 1A. FIG. 1B shows the interior of the circuit breaker unit 100 when the door 102 is open. The circuit breaker unit 100 may include a circuit breaker panel 103 having a plurality of circuit breakers 104 disposed therein, each circuit breaker being connected to a different circuit to provide overcurrent protection. Circuit breaker 104 has a toggle switch 106 that may be in the "on" position or the "off" position. When current is flowing in normal operation the toggle switch 106 is in the "on" position to allow the current to flow to the circuit protected by the circuit breaker 104. When circuit breaker 104 senses an overcurrent condition, the circuit breaker 104 switches off as a protective mechanism to prevent current from flowing to the circuit. When the circuit breaker 104 switches off, the toggle switch 106 may flip to the "off" position. The circuit breaker 104 can be re-set manually by flipping the toggle switch 106 back to the "on" position.

In some designs, the circuit breaker unit 100 and/or door 102 may be constructed of a metal, such as steel. The housing of the circuit breaker 104 and the toggle switch 106 may be formed of a hard plastic material. It should be appreciated, however, that these components may be formed of a variety of other materials, and are not limited to steel and plastic, respectively.

Figure 1C:
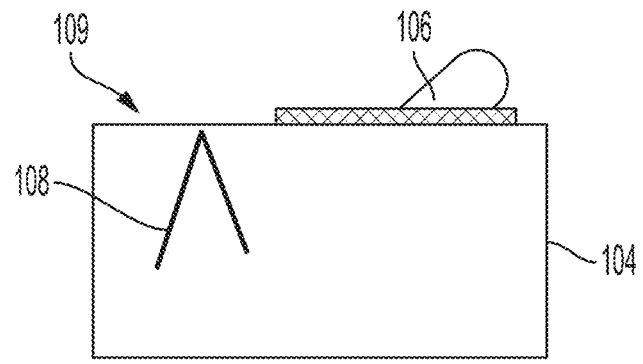
FIG. 1C shows a cross-sectional view of a circuit breaker.

FIG. 1C shows a cross-sectional view of a circuit breaker 104, including toggle switch 106 and a conductor 108. Conductor 108 carries the current for the circuit that is protected by the circuit breaker 104. For purposes of illustration, only a portion of conductor 108 is shown in FIG. 1C.

A circuit breaker typically may be constructed in a manner such that conductor 108 is positioned adjacent to the face 109 of the circuit breaker 104, as illustrated in FIG. 1C. Conductor 108 may be positioned in a region that is beyond the range of travel of toggle switch 106. The current flowing through conductor 108 creates a magnetic field in the proximity of conductor 108. In addition, the electric potential of conductor 108 creates an electric field in the proximity of conductor 108. In accordance with some embodiments, the electric field and/or the magnetic field produced by conductor 108 can be sensed outside of the housing of circuit breaker 104 and outside of the circuit breaker panel 103. In accordance with some embodiments, sensing of the electric field and/or the magnetic field produced by conductor 108 can be used for non-intrusive power monitoring of the circuit protected by circuit breaker 104.

Figure 1D:
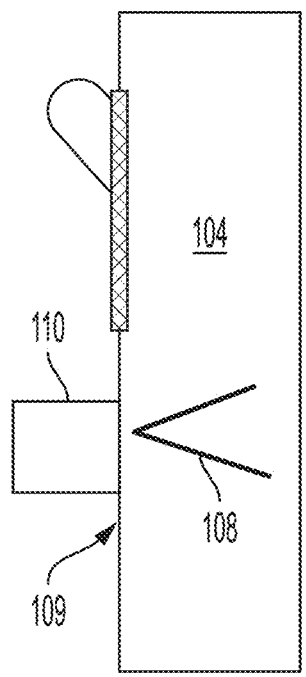
FIG. 1D shows placement of a sensor apparatus at the face of a circuit breaker.

FIG. 1D shows a sensor apparatus 110 that may be placed in the proximity of conductor 108 (e.g., near or at the face 109 of the circuit breaker 104) to detect the electric field produced by conductor 108, the magnetic field produced by conductor 108, or both. As used in this context, the terms "proximity" and "proximate" means that the sensor apparatus 110 is close enough to produce a sensed signal suitable for monitoring. In some embodiments, sensor apparatus 110 may be positioned in contact with the face 109 of the circuit breaker 104. Positioning the sensor apparatus 110 as close as possible to the conductor 108 may increase the magnitude of the detected signal. However, it should be appreciated that suitable detection can also be obtained when the sensor apparatus 110 is positioned farther from conductor 108.

Monitoring signals regarding the magnetic and/or electric field sensed by sensor apparatus 110 may be sent to another device using any suitable technique, such as via a wired connection and/or via a wireless link. U.S. Pat. No. 8,344,724 describes an example of a suitable technique in which signals can be transmitted through the circuit breaker door. However, the techniques described herein are not limited in this respect, as any suitable techniques may be used for sending signals from sensor apparatus 110 to another device.

Figure 2:
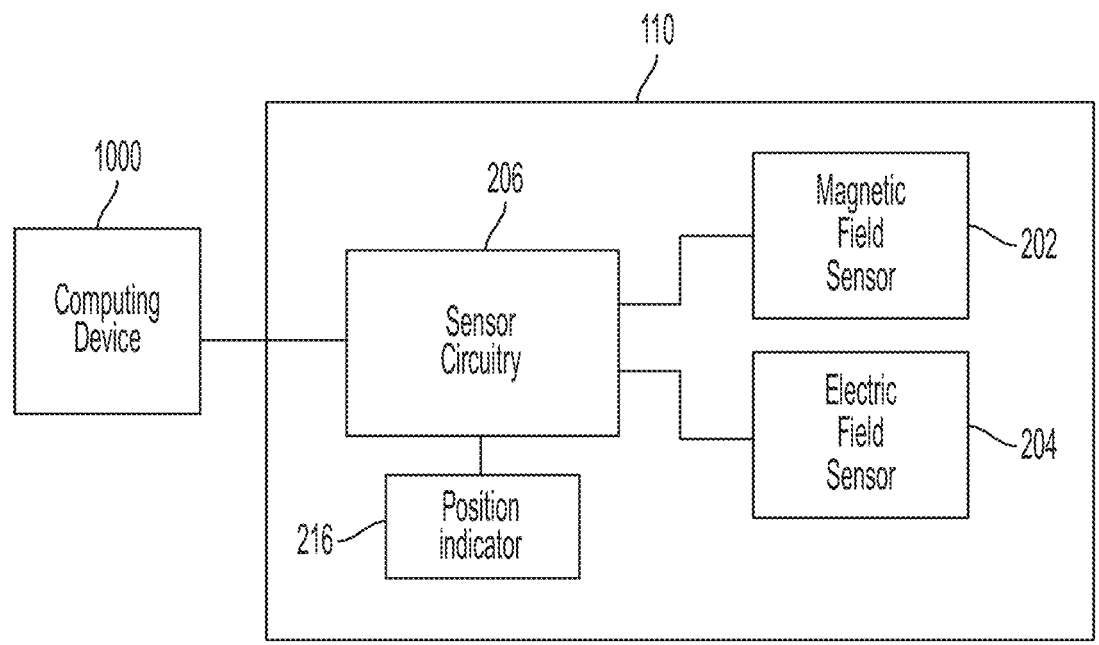
FIG. 2 shows a block diagram of a sensor apparatus, according to some embodiments.

FIG. 2A shows a block diagram of a sensor apparatus 110 capable of sensing electric and magnetic fields, according to some embodiments. Sensing the magnetic field produced by conductor 108 enables measuring the current through conductor 108. Sensing the electric field produced by conductor 108 enables measuring the voltage of conductor 108. Measuring both the voltage of and the current through conductor 108 can be advantageous, as it can allow obtaining additional information regarding the power provided to a load, such as phase information, by way of example. As shown in FIG. 2A, the sensor apparatus 110 may include a magnetic field sensor 202, an electric field sensor 204, an optional position indicator 216, and sensor circuitry 206. Sensor apparatus 110 need not include both a magnetic field sensor 202 and an electric field sensor 204, as in some embodiments a sensor apparatus 110 may include a magnetic field sensor 202 and no electric field sensor (as in sensor apparatus 180 of FIG. 18), or an electric field sensor 204 and no magnetic field sensor. In some embodiments, magnetic field sensor 202 may be a hall effect sensor or a tunneling magnetoresistive (TMR) sensor.

Measuring Voltage

In some embodiments, the voltage of a conductor can be measured non-intrusively using an electric field sensor. Measuring the voltage can be performed in addition to measuring the current, in some embodiments. Accurately measuring the voltage and current allows quantifying real and reactive power consumption.

The voltage of a conductor can be measured by placing a conductive pickup in a position to capacitively sense the electric field produced by the conductor. The conductor is thereby capacitively coupled to suitable sensor circuitry.

Figures 3A, 3B:
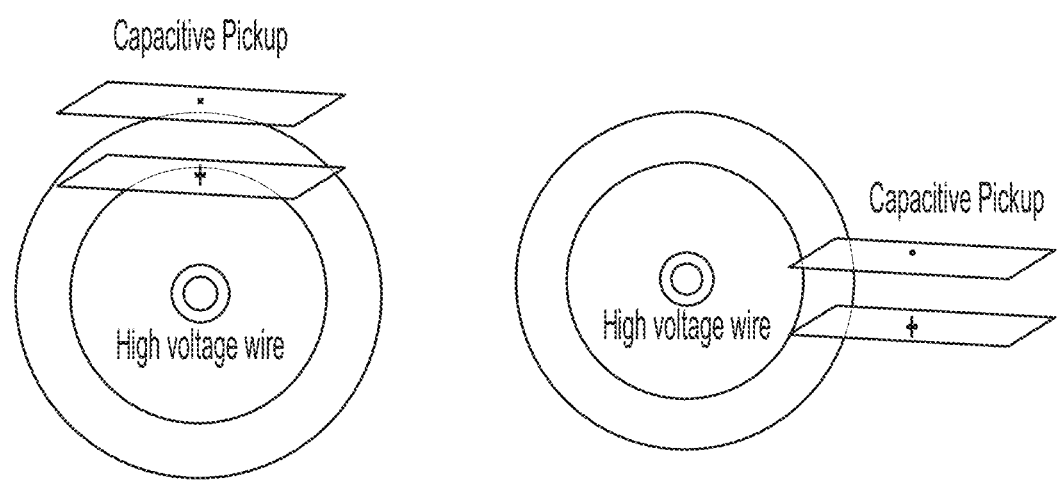
FIGS. 3A and 3B show a capacitive pickup.

While a single ended sensor design does detect electric fields well, it does not discriminate between electric fields directly below it (e.g. from a wire), and those existing elsewhere around—which that can be caused by many different sources of interference. To improve the specificity of the sensor with only a small reduction in sensitivity, a differential setup can be used. A differential sensor can be used for sensing of electric fields in any application described herein. FIGS. 3A and 3B show the operation of the differential capacitive pickup. This setup is particularly sensitive to fields produced directly below it, because this produces a strong differential measurement across the sensor plates. An additional benefit is the steeper roll off in sensitivity as the distance from the source increases. The magnitude of the output signal is proportional to strength of the electric field at the sensor plate that is described by Coulomb's law:

$$|E| \propto \frac{q}{r^2}$$

Here q is the charge on the wire and r is the distance from the wire to the sensor plate. For the differential circuit there are two plates stacked vertically, and if we assume a unit distance between the plates then the output of the sensor becomes:

$$|E| \propto \frac{q}{r^2} - \frac{q}{(1+r)^2}$$

This section presents a capacitively coupled non-contact voltage sensor which is specifically optimized for monitoring line voltage. The sensor uses two non-vibrating capacitive pickups to measure the rate of change of an unknown potential, and digitally integrates that rate of change in order to recover the original signal. This architecture allows for higher sensitivity and more robust disturbance rejection than previous designs have offered. The cost of the sensor may be low because the number of parts is small and the capacitive pickups can be integrated into a standard printed circuit board.

I. Introduction

Non-contact measurement of electric potential has proven useful for circumstances in which it is difficult to establish Ohmic contact with the conductors in question. Non-contact sensors offer ease of installation and robust high-voltage isolation in exchange for lower accuracy and increased susceptibility to external disturbances. Non-contact measurement of static electric potentials was first proposed by in 1928. In that technique, a vibrating plate is placed near an unknown potential, forming a time varying capacitance. The voltage of the vibrating plate is adjusted until the vibrations induce no current through the plate, indicating that the plate's potential is equal to the unknown potential. The bandwidth of the sensor is limited by the vibration frequency of the plate. Recent work has focused on capacitive sensors that do not vibrate. The induced current is integrated to obtain the unknown potential at the frequencies of interest. However, the gain of non-vibrating capacitive sensors is dependent upon the distance to the unknown conductor. Two sensor plates can be separately measured to compensate for this dependence. Alternatively, large sensor plates can be placed close to a wire in order to enter a regime of operation in which the transfer function is not dependent on the separation distance. The unique challenge of non-contact voltage sensing is reconstructing the input signal while rejecting pickup from other sources. Specifically, the currents induced by the input signal are integrated in order to recover the input voltage. However, the currents induced by other sources have significant low-frequency components, which are amplified by an ideal integrator. There is a fundamental tradeoff between the accuracy of voltage measurements and a sensor's signal-to-noise ratio.

Described herein is a non-contact voltage sensor that takes a differential measurement of two vertically stacked non-vibrating sensor plates in order to maximize the dependence of gain on plate-to-wire distance, so that the signal from a nearby wire is selected and the signals from more distant wires are rejected. The sensor is especially well suited to measurements that do not require the absolute scaling factor to be determined (e.g., total harmonic distortion and line regulation).

A new analog circuit can integrate the capacitive pickups and amplification into a 2 cm² printed circuit board which may include less than $3 of discrete components. The resulting signal is processed by a new digital filter which provides superior disturbance rejection and an exceptionally accurate frequency response.

II. Principle of Operation

A parasitic capacitance Cp develops between a sensor plate and a nearby wire. The sensor plate is coupled to AC ground by a resistance R and a capacitance C. The transfer function from the wire voltage to the sensor plate voltage is given by $$\frac{V_o(s)}{V_i(s)} = \frac{sRC_p}{sR(C+C_p)+1}. \quad (1)$$

Conventional capacitive-divider sensors choose R to be very large. The transfer function is then approximated by $$\frac{V_o(s)}{V_i(s)} \approx \frac{C_p}{C+C_p}.$$

If C is kept much smaller than Cp (which may entail careful construction), the equation simplifies further to $V_o(s) \approx V_i(s)$. Unfortunately, this approach may not be practical for the new sensor because Cp is tiny and the resistance would impractically large.

Instead, the new sensor may operate in the regime where $|sR(C+C_p)| \ll 1$ and so $$\frac{V_o(s)}{V_i(s)} \approx sRC_p. \quad (2)$$

The sensitivity of the sensor is proportional to frequency. It is inversely proportional to the distance d between the wire and the sensor plate, because $$C_p \propto \frac{1}{d}.$$

Figure 4:
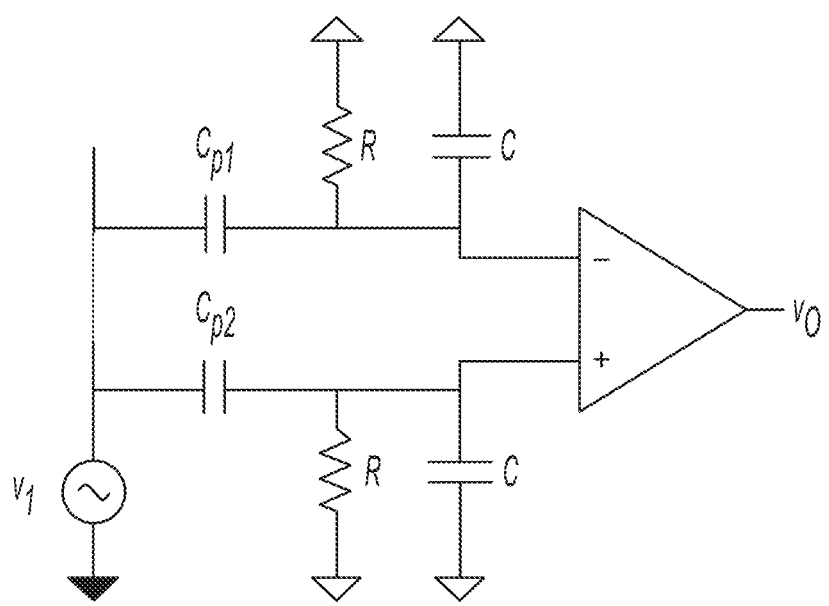
FIG. 4 shows a circuit for making a differential measurement from two capacitive pickup plates.

Note that the sensor measures the input signal $V_i$ relative to its own ground, which should be connected (or at least AC coupled) to the input signal's ground. Improved localization is obtained by taking a differential measurement from two stacked sensor plates. This arrangement is shown in FIG. 4. Parasitic capacitance between the two plates is neglected from this model because in the differential mode it is equivalent to additional capacitance between each plate and ground.

The transfer function of the differential sensor is given by $$\frac{V_o(s)}{V_i(s)} = \frac{sR(C_{p2}-C_{p1})(sRC+1)}{(sR(C+C_{p1})+1)(sR(C+C_{p2})+1)}. \quad (3)$$

For frequencies satisfying $|sRC| \ll 1$, the transfer function is approximated by $$\frac{V_o(s)}{V_i(s)} \approx sR(C_{p2}-C_{p1}) \quad (4)$$

which is analogous to (2) for the single-plate sensor. If the sensor plates are at a distance d from the wire and separated from each other by a distance $d_0 \ll d$, the differential capacitance is $$C_{p2}-C_{p1} \propto \frac{1}{d} - \frac{1}{d+d_0} \approx \frac{d_0}{d^2}.$$

Therefore the sensitivity of the differential sensor is inversely proportional to the square of the distance between the wire and the sensor plates. An alternative approximation aids in understanding the frequency-dependent behavior of the differential sensor. Where $C_{p1} \ll C$ and $C_{p2} \ll C$, the transfer function is roughly $$\frac{V_o(s)}{V_i(s)} \approx \frac{sR(C_{p2}-C_{p1})}{sRC+1}. \quad (5)$$

The input voltage is recovered by integrating the output voltage—in other words, the zero at the origin is cancelled by a new pole at the origin. At low frequencies, the remaining pole at $s=-1/RC$ has minimal effect. As the signal frequency increases, first order low-pass behavior wilt be observed. Once the output is integrated, the differential capacitance $C_{p2}$ $C_{p1}$ may be determined in order to identify the sensor gain and recover the original input signal. If this capacitance is not known, the output will include an unknown constant scaling factor.

III. Analog Implementation

There are two factors which determine the sensitivity and performance of the sensor: the geometry of the sensor plates, and the quality of the differential amplifier that is attached to them. Since the sensor should measure the voltage on one nearby wire without mixing in voltages from more distant wires, the sensor plates should not be made too large. The capacitance of the sensor plates then determines the maximum admissible input bias currents for the differential amplifier. Based on the size of service entry cable and typical clearance constraints around existing wiring, in some embodiments the sensor plates are designed to have an area of 0.5 to 2 cm², such as 1 cm². To minimize the cost of fabrication, the plates may be built into the bottom two layers of a standard 1.6 mm four-layer printed circuit board (PCB), or any other suitable circuit board. In a standard FR4 PCB, the bottom two layers are separated by 0.25 mm of laminate with a dielectric constant of approximately 4.5. Therefore the inter-plate capacitance is $$C_{ip} = 4.5 \cdot \varepsilon_0 \cdot \frac{1 \text{ cm}^2}{0.25 \text{ mm}} = 15.9 \text{ pF}.$$

With this information, the differential capacitance between the sensor plates and a nearby wire can be estimated. Suppose that the effective area of overlap between a wire and the sensor plates is 0.5 cm², and the wire and the closer plate are separated by 1 mm of insulation with a dielectric constant of 2.1 (such as Teflon). The capacitance between the wire and the closer plate is $$C_{p2}=2.1 \cdot \varepsilon_0 \cdot 0.5 \text{ cm}^2 \cdot 1 \text{ mm}=0.930 \text{ pF},$$

Then Cp1 is given by the series combination of Cp2 and Cip, i.e., $$\frac{1}{C_{p1}} = \frac{1}{C_{p2}} + \frac{1}{C_{ip}}$$

and the differential capacitance is $$C_{p2} - C_{p1} = \frac{C_{p2}^2}{C_{ip} + C_{p2}} = 0.051 \text{ pF}.$$

The amplifier's input bias currents should be much smaller than the currents injected into the bias resistors by Cp1 and Cp2. The limiting case is the lowest voltage of interest at the lowest frequency of interest—for design purposes, a 1 V signal at 60 Hz. The differential current produced by this signal is $$2\pi f(C_{p2}C_{p1}) \text{ V}=2\pi \cdot 60 \text{ Hz} \cdot 0.051 \text{ pF } 1 \text{ V}=19 \text{ pA}.$$

To avoid distorting the signal, the amplifier's input bias currents should not exceed about 1 pA. A low-cost instrumentation amplifier, such as the Texas Instruments INA332, meets this specification. In the differential mode, the interplate capacitance of Cip is equivalent to a capacitance between each plate and ground of $$2C_{1p}=31.8 \text{ pF}.$$

This capacitance reduces the bandwidth of the sensor and should be kept as small as possible. However, the amplifier is susceptible to common-mode disturbances which cause its inputs to exceed their allowable voltage range. In order to have some capacitive filtering of common mode inputs, an additional capacitance of 10 pF may be provided between each sensor plate and ground. This gives a total differential mode plate-to-ground capacitance of C=41.8 pF. The last design task is to select the bias resistors attached to the sensor plates. The sensor gain is given by $sRC_d$, so to maximize sensitivity R should be as large as possible. However, larger values of R increase the time constant RC and decrease the sensor bandwidth. A good balance between these requirements is achieved by R=1MΩ. The breakpoint of the input network is placed at $$\frac{1}{2\pi RC} = 3.81 \text{ kHz}$$

which is significantly faster than the signals of interest, but the sensor gain remains large enough to obtain usable voltage signals out of the amplifier. Using (5), the transfer function of the specified analog sensor is $$\frac{V_o(s)}{V_i(s)} \approx \frac{s \cdot 51 \text{ ns}}{s \cdot 42 \text{ μs} + 1}. \tag{6}$$

For sufficiently low frequencies, (4) applies and $$\frac{V_o(s)}{V_i(s)} \approx s \cdot 51 \text{ ns}.$$

Figure 5:
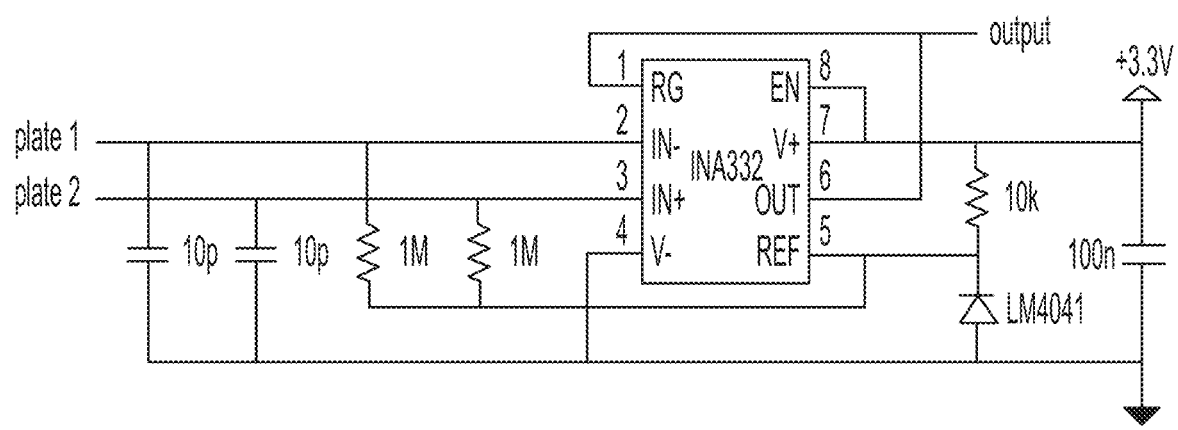
FIG. 5 shows the analog sensor schematic is given in FIG. 5
Figure 6:
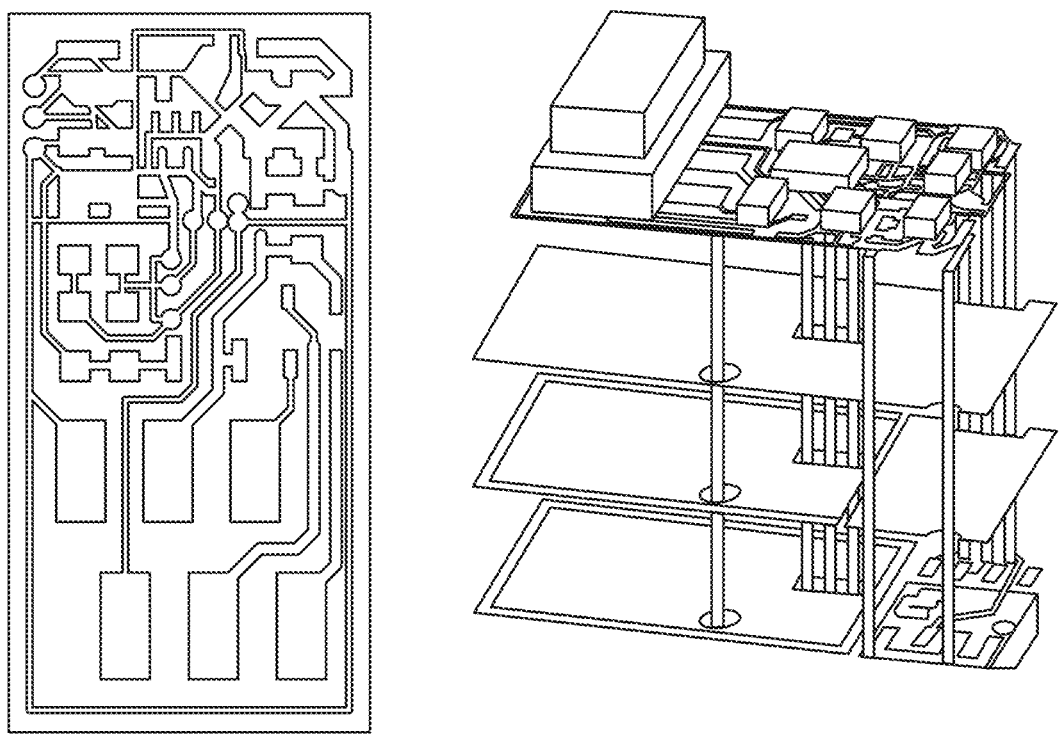
FIG. 6 depicts a PCB implementation.

The analog sensor schematic is given in FIG. 5 and the PCB is depicted in FIG. 6. FIG. 6 shows 2D and 3D exploded views of the sensor PCB. The board dimensions are 1 cm by 2 cm. From top to bottom, layers contain (1) connector, instrumentation amplifier, and supporting components, (2) ground plane, (3) sensor plate and ground plane, (4) sensor plate and Hall effect IC. Because of the high impedances present on the PCB, special care should be taken to include guard traces around sensitive nodes and to clean conductive residue from the board after assembly. (Because the new voltage sensor is intended for non-contact power metering applications, this PCB also includes footprints for a Hall effect-based magnetic field sensor, an EEPROM, and a connector for cabled attachment to a microcontroller.)

IV. Digital Signal Processing

The sensor output is integrated to recover the original voltage being measured. Good performance can be achieved by performing the integration digitally. The design of the integrating filter presents a fundamental tradeoff between accuracy and disturbance rejection. Specifically, there are three design criteria: 1) the filter should faithfully reconstruct the voltage being measured, 2) the filter should reject low frequency disturbances, such as those caused by thermal drift, and 3) The filter should recover quickly from impulsive disturbances. These characteristics correspond to the following three properties of a linear filter: 1) The filter's frequency response should be inversely proportional to the frequency, and introduce 90 degrees of phase lag, for every frequency present in the voltage being measured. 2) The filter's frequency response should roll off quickly below the frequencies of interest. 3) The filter's impulse response should be short. A causal analog filter cannot have a sharp transition between its stop band and pass band without introducing significant phase distortion—but if the transition to the stop band is gradual, low frequency disturbances will be admitted and amplified by the integrator. Throughout this section, a refers to a normalized angular frequency with units of radians per sample. Suppose that there are 2N samples per line cycle, so that the frequency of the nth harmonic is πn/N radians per sample. The frequency response of an ideal integrating filter is given by $$H_i(\omega) = \frac{\pi}{j\omega N}. \tag{7}$$

(This filter is "ideal" only in that it integrates signals perfectly and has a unit magnitude response at line frequency. It does not satisfy the second and third filter requirements.) If the sampled line frequency of π/N radians per sample corresponds to 60 Hz in continuous time, the frequency response of an analog filter is given by $$H_a(\omega) = \frac{j\omega\pi/N}{(j\omega + 1/\tau_0)(j\omega + 1/\tau_1)} \quad (8)$$

with $$\tau_0 = (2.2 \; \mu F) \cdot (12.1 \; k\Omega) \cdot (60 \; Hz) \cdot 2N$$

$$\tau_1 = (2.2 \; \mu F) \cdot (47 \; k\Omega) \cdot (60 \; Hz) \cdot 2N.$$

This analog filter is compared to digital finite impulse response (FIR) filters. The FIR filters have antisymmetric impulse responses (such filters are known as "Type 3" FIR filters). As a consequence, they have zero group delay, introduce 90 degrees of phase lag at all frequencies, and do not pass signals at zero frequency or at the Nyquist rate. The first FIR filter is the Type 3 filter with 2N−1 taps whose frequency response H1 satisfies $$H_1\left(\frac{\pi n}{N}\right) = \frac{1}{jn} \; n \in \mathbb{Z}, \; 1 \le |n| < N.$$

The second FIR filter is a Type 3 filter with 4N−1 taps whose frequency response $H_2$ satisfies $$H_2\left(\frac{\pi n}{2N}\right) = \frac{2c_n}{jn} \; n \in \mathbb{Z}, \; 1 \le |n| < 2N$$

with $$c_n = \begin{cases} 1/2 & |n| = 1 \\ 1 & 2 \le |n| < 2N - 1 \\ 3/4 & |n| = 2N - 1 \end{cases}.$$

The filter impulse responses are computed using the inverse discrete Fourier transform $$h_1[t] = \frac{1}{N} \sum_{n=1}^{N-1} \left(\frac{1}{n} \cdot \sin\left(\frac{\pi n t}{N}\right)\right) \quad |t| < N \quad (9)$$

$$h_2[t] = \frac{1}{N} \sum_{n=1}^{2N-1} \left(\frac{c_n}{n} \cdot \sin\left(\frac{\pi n t}{N}\right)\right) \quad |t| < 2N \quad (10)$$

where t is an integer representing the discrete time.

Figure 7:
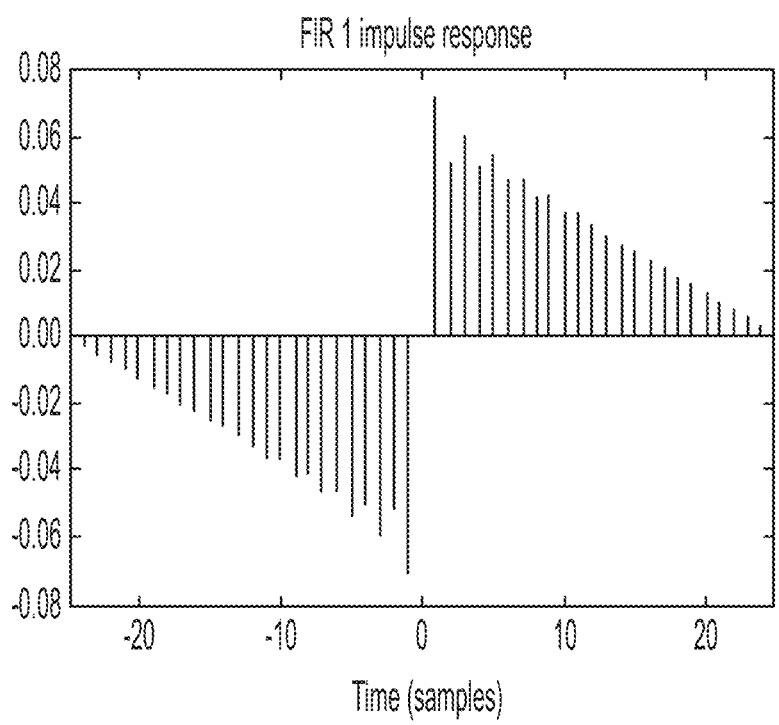
FIG. 7 shows the impulse response for FIR 1.
Figure 8:
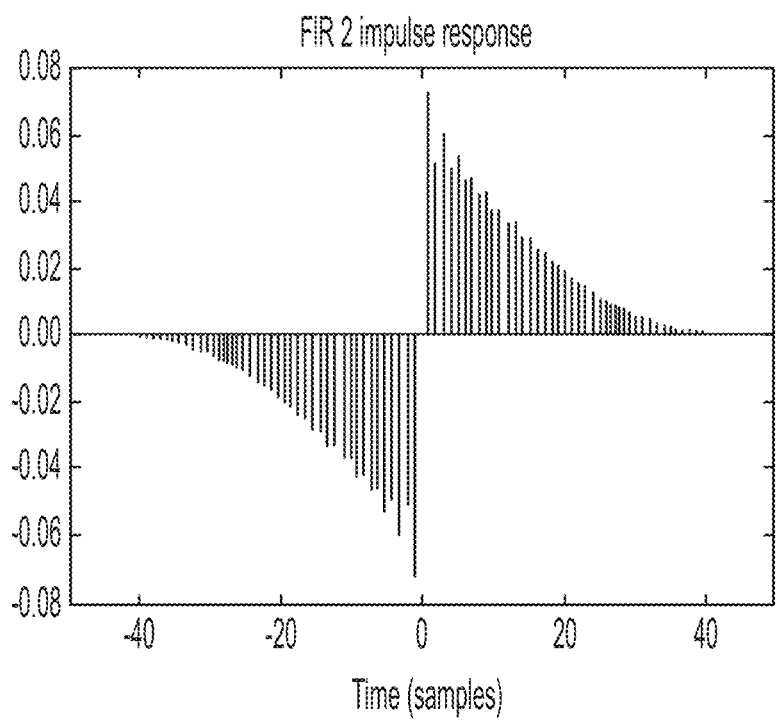
FIG. 8 shows the impulse response for FIR 2.
Figure 9:
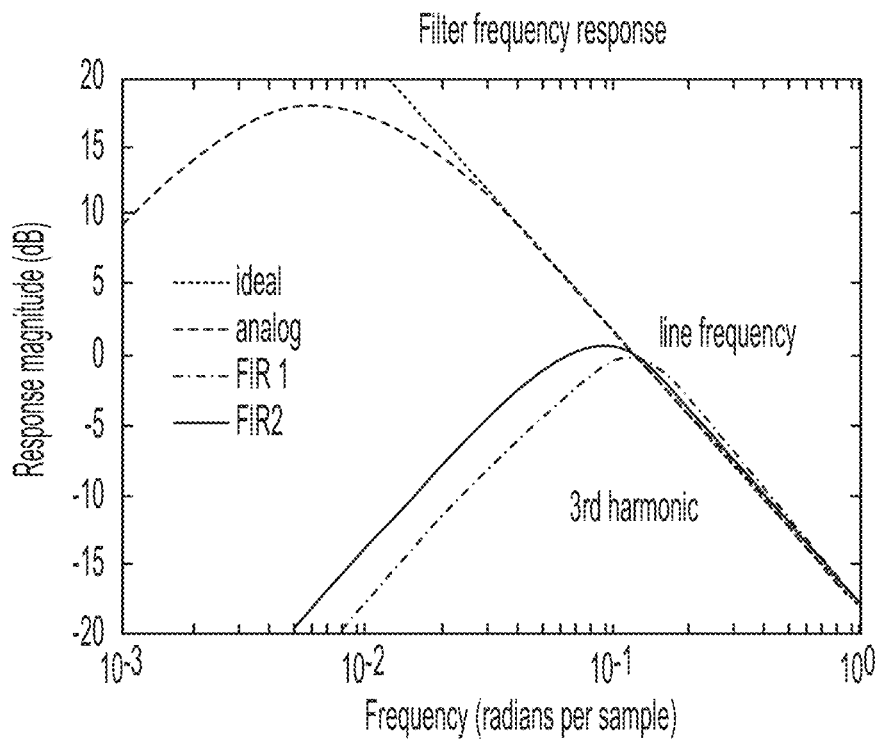
FIG. 9 shows the magnitude response of each filter
Figure 10:
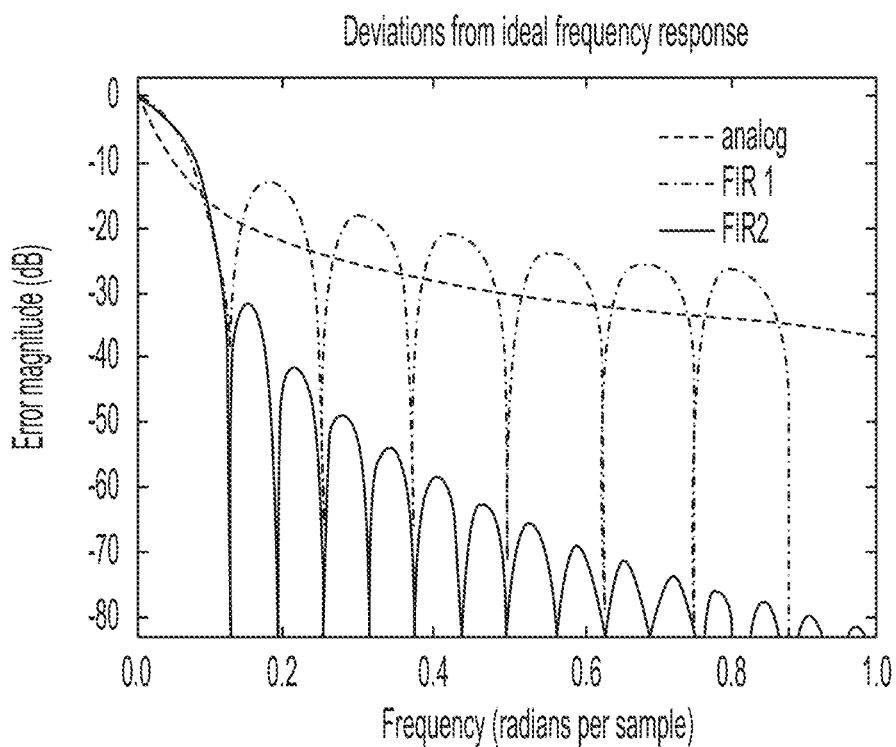
FIG. 10 shows the relative magnitude of the difference between each filter's response and the ideal response.

The impulse responses are plotted in FIGS. 7 and 8. FIG. 7 shows the impulse response for FIR 1 of $h_1[t]$ for N=25. The impulse response is zero when the absolute value of t is greater than or equal to 25. FIG. 8 shows the impulse response for FIR 2 of $h_2[t]$ for N=25. The impulse response is zero when the absolute value of t is greater than or equal to 50. By definition $H_1(\omega)=H_2(\omega)=H_1(\omega)$ at line frequency and all of its harmonics below the Nyquist rate. $h_1$ is the shortest impulse response whose Fourier transform has this property, and $h_2$ is designed to have a smoother frequency response at the expense of being twice as long as $h_1$. From the impulse responses, the discrete time Fourier transform gives the continuous frequency responses. FIG. 9 shows the magnitude response of each filter and FIG. 10 shows the relative magnitude of the difference between each filter's response and the ideal response. FIG. 9 shows the magnitude behavior of the filters for N=25. The analog filter introduces phase distortion which is not depicted on this plot. Amplification of low frequency disturbances is roughly proportional to the area under the left half of the response curve. FIG. 10 shows the magnitudes of the relative deviations from the ideal frequency response for N=25. Both of the FIR filters have zero error at line frequency and its harmonics. Deviation from the ideal response is desirable at frequencies below line frequency. We consider the response of each filter to the signal $$r[t]\sin(\pi t/N \ne 60/30) + 30\delta[t].$$

Figure 11:
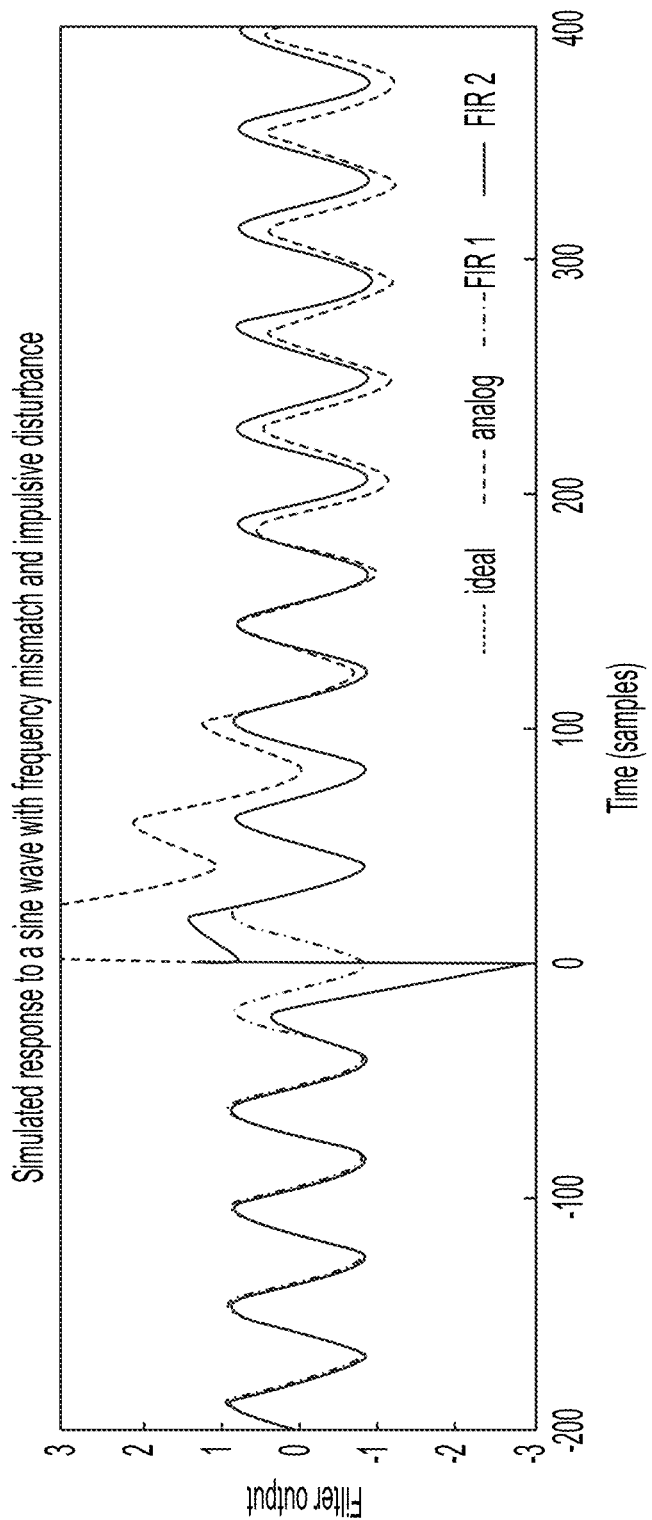
FIG. 11 shows the simulated response of the filters to an impulsive disturbance.

This represents the case where the digital filters were designed for a line frequency of 50 Hz but the actual frequency is 60 Hz, and an impulsive disturbance of magnitude 30 occurs at time t=0. These responses are plotted in FIG. 11 and exemplify the benefits and drawbacks of each type of filter. FIG. 11 shows the simulated response of the filters to an impulsive disturbance with magnitude of 30 at t=0. The disturbance affects FIR1 for a magnitude of t less than 25, and affects FIR 2 for a magnitude of t less than 50. The analog filter has not yet recovered from the disturbance at t=400. The filters are designed for a line frequency of 50 Hz with N=25, but the input signal is provided at 60 Hz to demonstrate that the filters perform well even when the line frequency is not known in advance.

Figure 12:
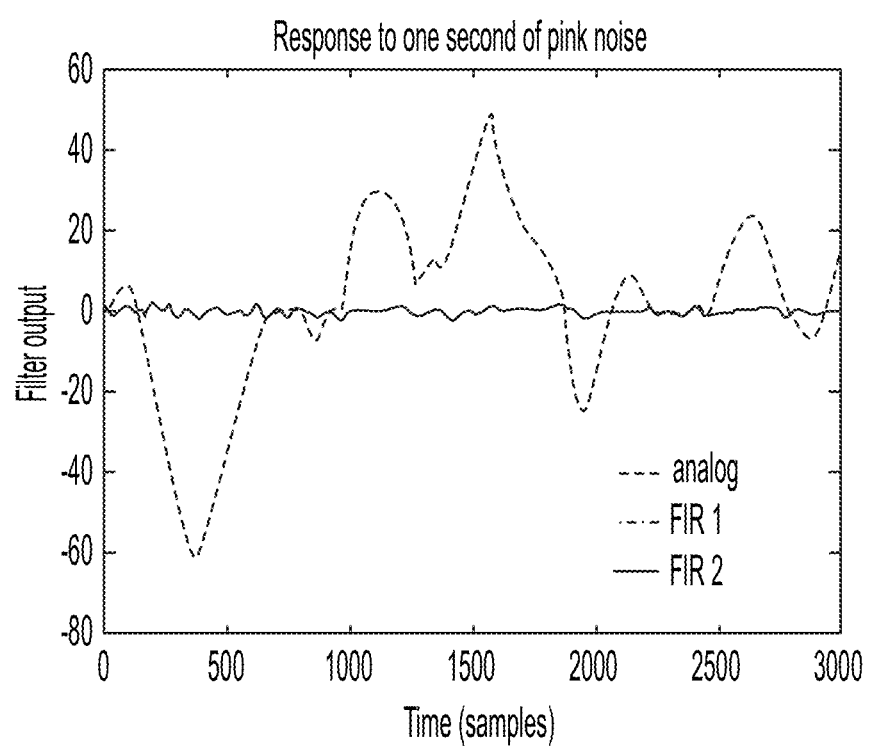
FIG. 12 shows the disturbance rejection of the filters in response to pink noise.

Lastly, to illustrate the superior disturbance rejection of the digital filters, the output of each filter is computed for the same input sequence of pink (i.e., 1/f) noise. The results are plotted in FIG. 12. Clearly, the analog filter exhibits a greater amount of error amplification. Although the FIR filters are non-causal, both become causal when composed with a finite time delay. It is therefore possible to implement them, with the caveat that the output will not be known in real time. In particular, the first FIR filter delays its outputs by half of a line cycle and the second FIR filter delays its outputs by one full line cycle.

V. Experimental Results

Figure 13:
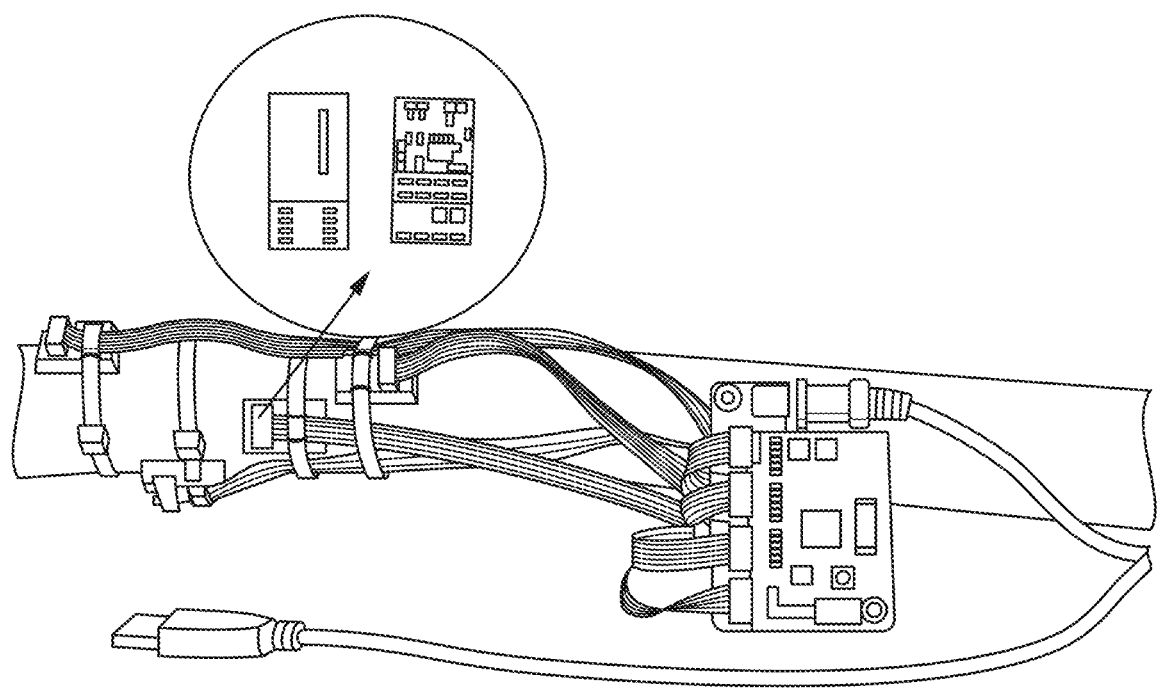
FIG. 13 illustrates a sensing implementation.
Figure 14:
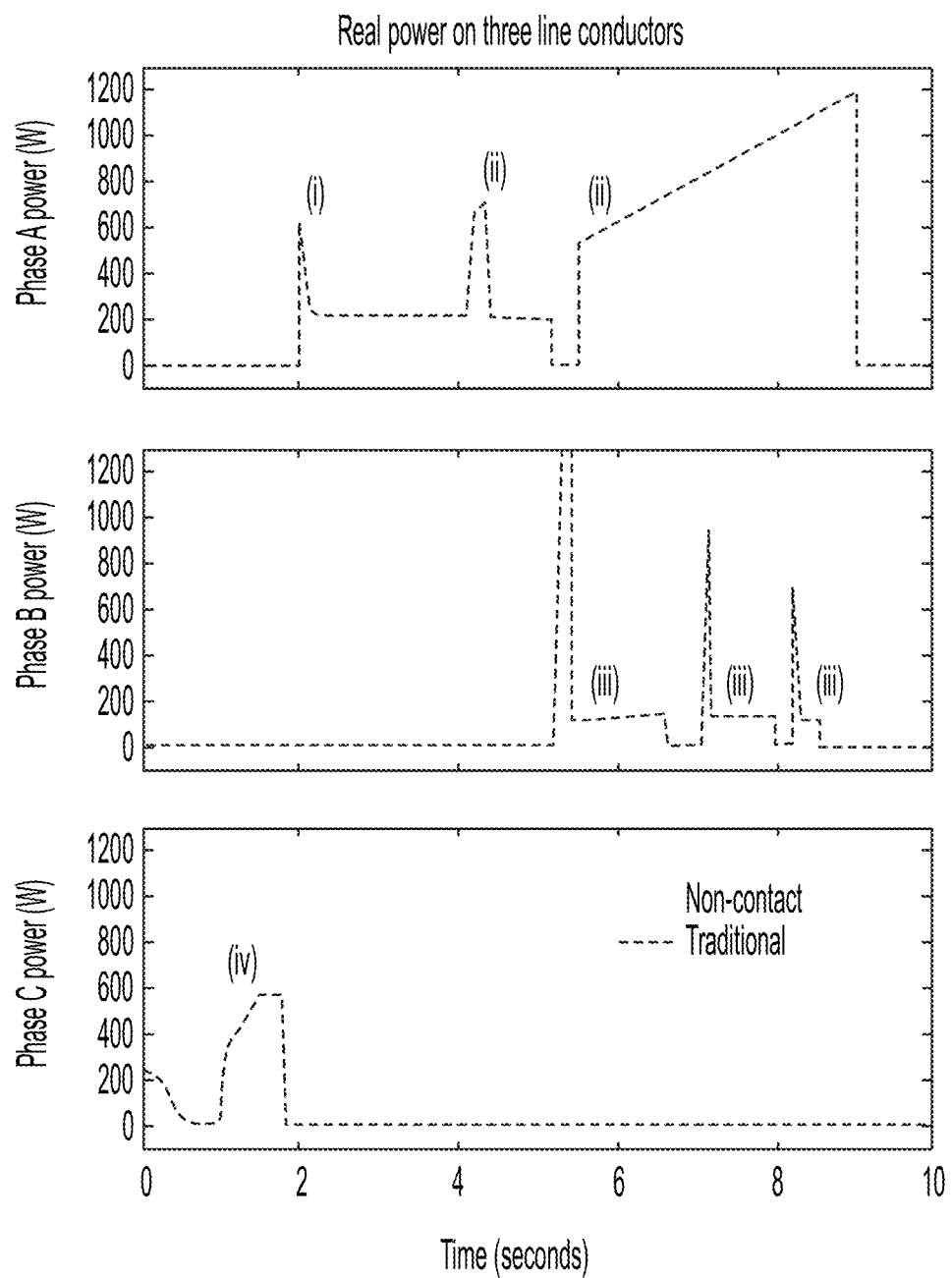
FIG. 14 shows turn-on transients for various loads.
Figure 15:
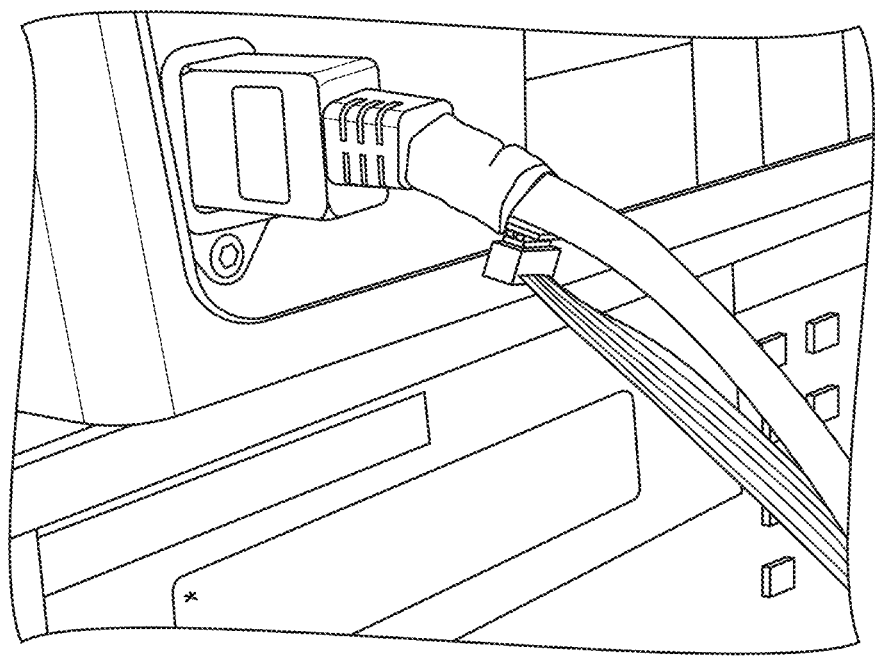
FIG. 15 shows an experimental setup.

The new voltage sensor was used together with Hall effect magnetic field sensors to perform non-contact power metering as shown in FIG. 13. The voltage sensors were strapped to a service entrance cable. The non-contact power meter was installed in parallel with a traditional power meter so that the results could be compared. Various electrical loads were switched on and off in order to obtain the time series data depicted in FIG. 14. Mismatch between the traditional power meter and the non-contact power meter did not exceed 10 W over a dynamic range of 1000 W, showing that the new voltage sensor was able to accurately distinguish real and reactive power. FIG. 14 shows turn-on transients depicted as (i) a 250 W incandescent lightbulb, (ii) a 1500 W space heater, (iii) an 0.25 hp induction motor, and (iv) a 600 W bank of dimmable incandescent lightbulbs. In order to obtain more detailed results showing the performance of the new digital filters, the voltage sensor was attached to an 18-AWG computer power cable with line voltage supplied by an HP 68348 AC source. (This cable was chosen because thinner conductors produce the smallest coupling capacitance and therefore pose the most difficult sensing challenge.) This experimental setup is shown in FIG. 15. The sensor was attached to an Atmel SAM4S microcontroller, which sampled the sensor with its built in ADC at a sample rate of 3 kHz and processed the signal using both of the FIR filters. The analog filter of was constructed using a Texas Instruments OPA4376 operational amplifier and its output was connected to a second ADC channel. The output from all three filters was streamed from the microcontroller to a computer. With a line frequency of 60 Hz, there were 50 samples per line cycle and N=25. The output voltage from each filter was measured for sinusoidal inputs at various voltages and frequencies. Equation (4) was solved to find that the differential capacitance was 1.22 pF at 120 V and 60 Hz. At other voltages and frequencies, the percent magnitude error was computed for the output of each filter. The phase error of the analog filter relative to the (zero-phase) digital filters was also computed. This data is given in Tables I and II, below.

TABLE I

OUTPUT ERROR FROM EACH FILTER FOR VARIOUS INPUT VOLTAGES AT 60 Hz.

| Input V RMS | Analog % error | FIR 1 % error | FIR 2 % error | Analog phase error, degrees |
|---|---|---|---|---|
| 30 | 5.7 | 2.3 | 2.3 | 8.92 |
| 60 | 3.7 | 1.6 | 1.6 | 9.04 |
| 90 | 1.1 | 0.0 | 0.0 | 9.07 |
| 120 | 0.3 | 0.0 | 0.0 | 9.09 |
| 150 | 1.0 | 1.2 | 1.2 | 9.11 |
| 180 | −0.5 | 0.8 | 0.8 | 9.16 |
| 210 | −2.2 | −0.0 | −0.0 | 9.21 |
| 240 | −3.3 | −0.1 | −0.1 | 9.29 |
| 270 | −3.8 | 0.3 | 0.3 | 9.34 |
| 300 | −1.5 | 0.5 | 0.5 | 9.40 |

TABLE II

OUTPUT ERROR FROM EACH FILTER FOR VARIOUS INPUT FREQUENCIES AT 30 V RMS.

| Input Hz | Analog % error | FIR 1 % error | FIR 2 % error | Analog phase error, degrees |
|---|---|---|---|---|
| 60 | 5.7 | 2.3 | 2.3 | 8.92 |
| 120 | 2.9 | −1.7 | −1.7 | 4.98 |
| 180 | 2.5 | −2.7 | −2.7 | 3.69 |
| 240 | 1.9 | −3.8 | −3.8 | 3.06 |
| 300 | 1.0 | −4.2 | −4.2 | 2.69 |
| 360 | 0.8 | −5.2 | −5.2 | 2.48 |
| 420 | 0.1 | −6.2 | −6.2 | 2.33 |
| 480 | −1.3 | −7.6 | −7.0 | 2.22 |
| 540 | −2.8 | −9.1 | −9.1 | 2.16 |
| 600 | −4.8 | −11.2 | −11.2 | 2.14 |

Figure 16:
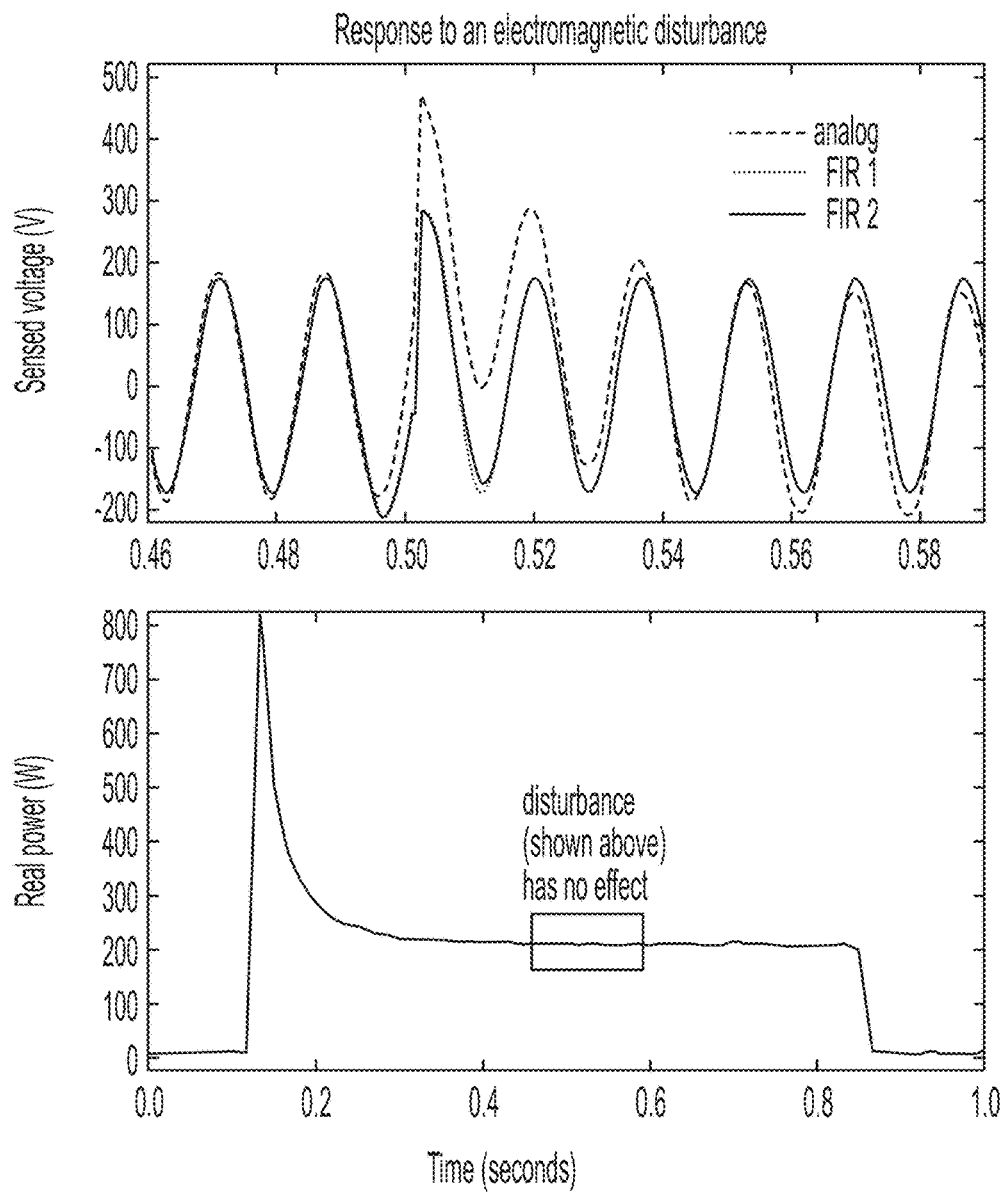
FIG. 16 shows the response of three filters to turning on a fan motor.

The collected data shows that the digital filters significantly outperform the analog filter with respect to phase lag and voltage linearity. As predicted by (5), all filters suffer from frequency-dependent gain, with a slightly more pronounced effect for the digital filters. 4 The new sensors with digital filters exhibit error less than 5% over all voltages up to 300V and frequencies up to 300 Hz. Finally, the disturbance rejection of each filter was tested by turning off a 100 mA fan motor at a distance of 30 cm away from the sensor. (The motor does not have a clamp circuit, so an inductive voltage spike generates a strong electric field every time it is turned off.) The response of the three filters to this situation is shown in FIG. 16. There is good agreement with the simulated behavior. The digital filters are only affected by the disturbance for one or two line cycles, but the analog filter has not recovered after many line cycles. FIG. 16 also shows that the signal filters prevent the disturbance from affecting power metering.

VI. Conclusions

Non-contact sensors allow the measurement of high voltages in a constrained setting without the need for high-voltage isolation or a complex installation. Careful design of a digital filter improves the accuracy and disturbance rejection of the capacitively coupled voltage sensor. With the new digital filters, linearity is better than ±5% up to 300 V and 300 Hz. Microcontrollers with integrated ADCs are sufficiently inexpensive that even with the digital filter and all supporting hardware, the new voltage sensor can be built for less than $10 of parts. If exact measurement of voltage is needed, the new sensor may be calibrated against a known reference voltage. But many power quality metrics-such as total harmonic distortion and line regulation—are unaffected by changes of a constant scaling factor. The new sensor's superior accuracy and disturbance rejection enable non-contact power metering to succeed in spite of electromagnetic disturbances. Together with the sensor's low cost, this makes the use of non-contact voltage sensors practical in a wide variety of new applications.

Measuring Current

In many systems of interest there are multiple current-carrying conductors. If the magnetic fields of the conductors overlap, the output of any single non-contact sensor will be a combination of these fields, misrepresenting the current flowing in the nominal conductor of interest. Each non-contact sensor picks up significant interference from current in the neighboring conductor. This section introduces techniques to accurately measure individual currents with non-contact sensors in environments with complex, superposed magnetic fields.

Non-contact electromagnetic field sensors monitor power transmission in multiple-conductor cables from a distance. Knowledge of the cable and sensor geometry is generally needed to determine the linear transformation which recovers voltages and currents front the sensed electromagnetic fields. This section presents a new calibration technique that enables the use of noncontact sensors without any prior knowledge. Calibration of the sensors is accomplished with a reference load or through observation of in situ loads.

An electric current flowing through a conductor produces a magnetic field whose magnitude at any point in space is proportional to the current. Similarly, a voltage applied to a conductor produces an electric field whose magnitude is proportional to the voltage. The voltage and current in a conductor may thus be determined by electric and magnetic field sensors placed nearby. The appeal of this technique is that it works at a distance, i.e., it is not necessary to remove the insulation from a wire in order to measure its voltage and current. In contrast to traditional metering equipment, non-contact sensors have a lower cost of installation because they do not require power to be shut down by an electrician.

Figure 17:
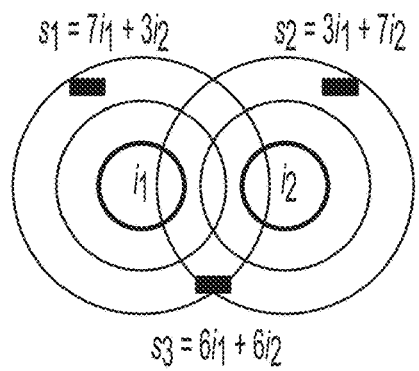
FIG. 17 shows a schematic of non-contact magnetic field sensor deployment with two conductors and three sensors.

When a cable contains multiple conductors, the electric and magnetic fields from each superpose linearly. Thus a magnetic field sensor records a linear combination of the currents through each conductor (as depicted in FIG. 17) and an electric field sensor records a linear combination of the voltages on each conductor. With enough sensors in different locations, the linear transformation from currents and voltages to sensor readings is invertible and the original currents and voltages may be recovered. The process of determining the transformation from sensor readings to voltages and currents is called "calibration". FIG. 17 shows a schematic of non-contact magnetic field sensor deployment with two conductors and three sensors. The quantities s1, s2 and s3 are magnetic field strengths. The quantities i1 and i2 currents.

In energy monitoring applications, the voltage is typically regulated to a constant amplitude. In order to measure power transmission, it is only necessary to (i) recover the conductor currents from the sensed magnetic fields and (ii) determine the phase of each current relative to the phase of the corresponding voltage. This section describes an algorithm to achieve these goals while providing the following capabilities:

1) The number of sensors may be made larger than the number of conductors, and accuracy is improved by each additional sensor.
2) The mathematics remain computationally tractable even with a large number of sensors.
3) The number of conductors does not need to be known in advance.
4) The calibration technique is extended to the case of three-phase delta-connected power distribution.
5) Calibration may be completed up to a constant scaling factor multiplying each current without the use of a reference load. The scaling factor is then determined by comparison with the utility power meter over a longer period of time.
6) If a reference load is used, it may be attached to each conductor multiple times, and it is not necessary to know which conductor is connected each time.

The paper section by developing the calibration algorithm for DC systems that have an external path for return currents. The algorithm is then generalized to handle AC systems, systems without an external path for return currents, and three-phase delta-connected AC systems.

Lastly, the algorithm is modified to use observation of in situ loads in place of a reference load.

II. Calibration Algorithm

This section considers the case of DC systems that have an unmonitored conductor to carry return currents. For example, most automobiles use 12 V DC distribution wires and return currents through the metal chassis. This section also assumes the use of a known reference load. The reference load is switched at a particular frequency and demodulation scheme is used to distinguish it from any other loads which are present.

Suppose that there are k magnetic field sensors monitoring a cable with n conductors. The currents through the cable at time t are $$i(t) = \begin{bmatrix} i_1(t) \\ \vdots \\ i_n(t) \end{bmatrix}$$

and the sensed magnetic fields are $$s(t) = \begin{bmatrix} s_1(t) \\ \vdots \\ s_k(t) \end{bmatrix}.$$

Each sensor detects a mixture of the magnetic fields due to each current, so the sensor geometry and the laws of physics determine a k-by-n matrix M satisfying $$s(t) = Mi(t). \quad (1)$$

The goal of calibration is to find an n-by-k matrix K satisfying $$i(t) = Ks(t) \quad (2)$$

using no information other than measurements of s.

Throughout this section lowercase boldface letters will refer to column vectors and uppercase boldface letters will refer to matrices.

If k<n, such a K does not exist. This situation is resolved by adding additional sensors. If k is greater than or equal to n, matrix K is chosen to be the pseudoinverse of M. This K has the smallest condition number of any left inverse of M, so it minimizes the sensitivity of the unmixed currents to electromagnetic noise and physical perturbations. In general, the pseudoinverse of a matrix M will be denoted by $M^+$.

Figure 18:
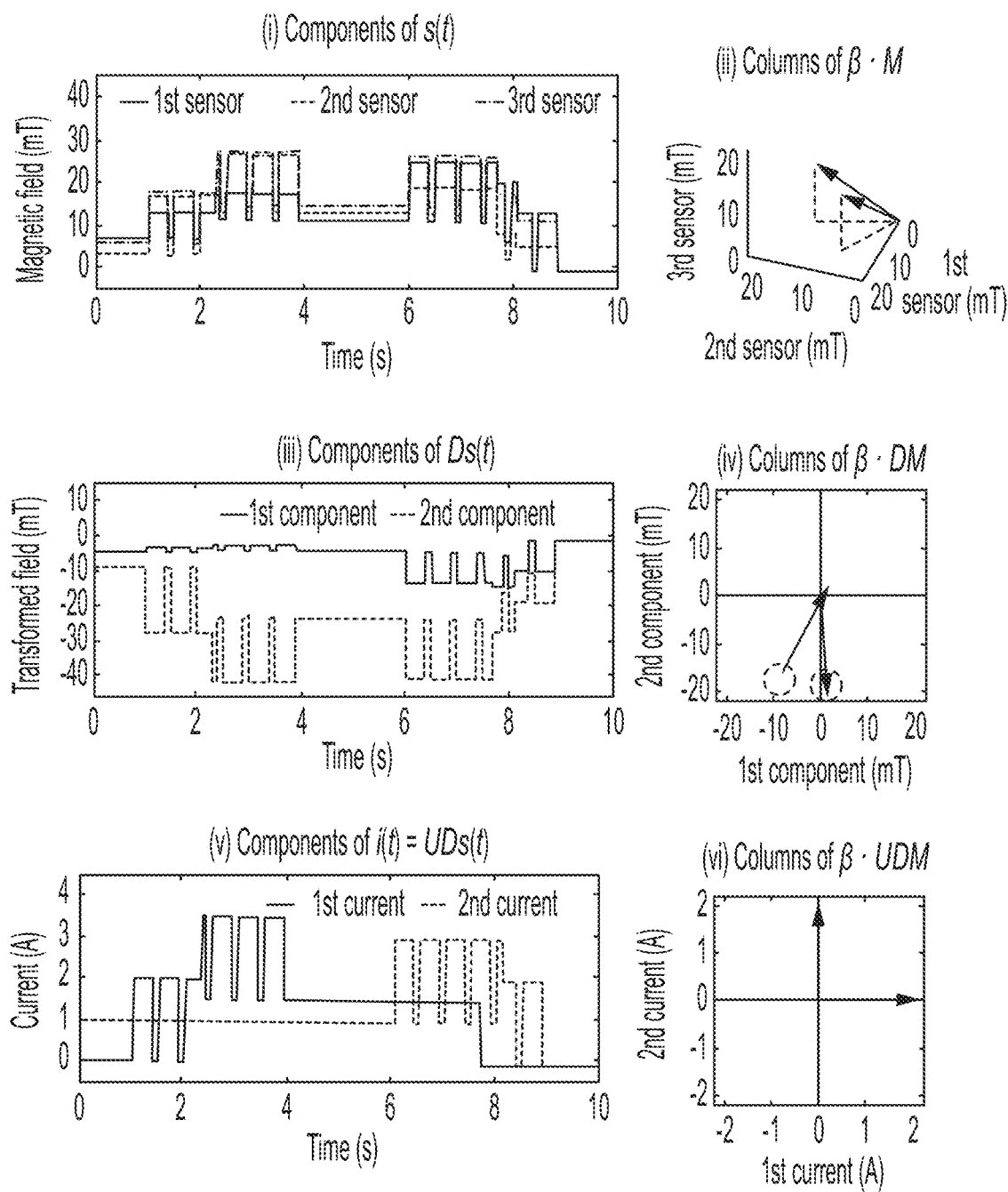
FIG. 18 shows various sensor readings.

The matrix $K=M^+$ is decomposed into a product $M^+=UD$ such that U is an invertible n-by-n matrix and D is an n-by-k matrix whose rows are orthonormal. FIG. 18 illustrates the behavior of this decomposition for the system of FIG. 17. To begin with, FIG. 18(i) depicts ten seconds of simulated sensor readings. Multiplication by D reduces the sensor readings from three dimensions to two, as shown in FIG. 18(iii). Finally, multiplication by U recovers the original conductor currents, as shown in FIG. 18(v).

Suppose that the reference load draws a current of β which is modulated at a particular frequency and duty cycle. FIG. 18(v) depicts a reference load with β=2 A that is modulated at 2 Hz with a 75% duty cycle in the presence of background loads. When the reference load is attached to the xth conductor, it draws a modulated current of βix (where ix denotes the ith basis current, i.e. the length-n vector with a 1 in the xth position and zeros everywhere else). The resulting magnetic field is M times βix—in other words, it is equal to (3 times the xth column of M. FIG. 18(ii) depicts these magnetic field vectors for a 2 A reference load used with the system of FIG. 17.

FIG. 18 shows a graphical depiction of the unmixing procedure proceeding simultaneously in the dime domain and in vector space. As depicted in FIG. 17, there are three sensors and two conductors. The reference load draws a current of β=2 A modulated at 2 Hz on the first conductor for 1<t<4 and on the second conductor for 6,t,9. There is an additional current of β=1.5 A on the first conductor for 2.3<t<7.7 and an additional current of 1 A on the second conductor for t<8.1.

In general, a demodulation algorithm is used to detect the presence of the reference load and determine the sensed magnetic fields which are due to each current that it draws. Suppose that p runs of the reference load are detected (where p is greater than or equal to n) and that the demodulated sensor readings in the xh run are equal to $\sigma_x$. If the reference load switches on at time t, then $$\sigma_x = s(t_z+\epsilon) - s(t_x-\epsilon)$$

for a sufficiently small value of c. The demodulation algorithm is simply a more robust method of determining this quantity in the presence of other loads.

After the reference load has been attached to every conductor, the k-by-p matrix $$\Sigma = [\sigma_1 \ldots \sigma_p] \quad (3)$$

is assembled and the eigendecomposition of the k-by-k matrix ΣΣ' is computed. Because ΣΣ' is Hermitian positive semidefinite, its eigenvalues are non-negative real numbers and its eigenvectors are orthonormal. Suppose that the eigendecomposition is given by $$\Sigma\Sigma' = [\rho_1 \ldots \rho_k] \begin{bmatrix} \lambda_1 & & 0 \\ & \ddots & \\ 0 & & \lambda_k \end{bmatrix} \begin{bmatrix} \rho'_1 \\ \vdots \\ \rho'_k \end{bmatrix} \quad (4)$$

where the $p_x$ are orthonormal k-element column vectors and $\lambda_x \geq \lambda_{x+1}$.

Although the columns of $\Sigma$ are 1-dimensional vectors, they all correspond to valid sensor readings and so they all lie in an n-dimensional space defined by the image of M. Therefore the rank of $\Sigma$ is equal to n, and $\lambda_x = 0$ for $x > n$. In practice, any noise added to the sensor readings may cause these eigenvalues to be slightly greater than zero. The gap between the smallest nonzero eigenvalue and the largest zero eigenvalue is bounded by the signal-to-noise ratio of the sensors, so counting the nonzero eigenvalues of $\Sigma\Sigma'$ is a robust method to determine n.

The eigendecomposition of $\Sigma\Sigma'$ also provides the Matrix $$D = [\rho_1 \ldots \rho_n]^t. \quad (5)$$

It has been proven there exists an invertible U such that $M^+ = UD$, and furthermore, that $M^+$ is the only left inverse of M which may be written as a product of a matrix U with this D. FIG. 17(iv) illustrates that D projects the columns of M into an n-dimensional subspace while preserving their lengths and the angles between them. All that remains is to find the matrix U.

A spectral clustering algorithm may be used to group the vectors $\sigma_x$ by conductor. The distance function d used by the clustering algorithm is the angle between the lines spanned by two reference load signatures, i.e., $$d(\sigma_x, \sigma_y) = \arccos\left(\frac{\|\sigma_x' \sigma_y\|}{\|\sigma_x\| \|\sigma_y\|}\right). \quad (6)$$

Because D preserves the angles between reference signatures, $$d(\sigma_x, \sigma_y) = d(D\sigma_x, D\sigma_y)$$

and the clustering can be performed in n-dimensional space. The elements of this space are expected to be clustered near columns of $\beta \cdot DM$, as indicated by the dashed regions in FIG. 18(iv).

Suppose that the clustering algorithm partitions $D\sigma_1, \ldots, D\sigma_p$ into n clusters and selects a representative element $\delta_x$ for the xth cluster. Because the xth cluster corresponds to the xth conductor, the reference load currents are given by $$\beta \hat{i}_x = U \delta_x.$$

This equation is solved for U to obtain $$U = \beta [\delta_1 \ldots \delta_n]^{-1}. \quad (7)$$

and calibration is finished. FIG. 18(vi) shows that multiplying $\beta M$ by UD on the left recovers the original reference currents $\beta i_x$.

---

Algorithm 1 Calibration for direct currents with external path for return current.

---

Require: each reference load signature present in s is equal to $\beta$ times a column of some matrix M, and all columns of M are represented by reference load signatures.
Ensure: K is the pseudoinverse of M, up to a permutation of its rows.
    function CALIBRATE(s, $\beta$)
        $\sigma_* \leftarrow$ FINDREFERENCELOADS(s)
        $\Sigma \leftarrow [\sigma_1 \ldots \sigma_p]$ -continued

---

Algorithm 1 Calibration for direct currents with external path for return current.

---

$\lambda_*, \rho_* \leftarrow$ EIGENDECOMPOSITION($\Sigma\Sigma'$)
        n $\leftarrow$ COUNTNONZERO($\lambda_1, \ldots, \lambda_k$)
        D $\leftarrow [\rho_1 \ldots \rho_n]^t$
        $\delta_* \leftarrow$ SPECTRALCLUSTER($D\sigma_1, \ldots, D\sigma_p$)
        U $\leftarrow \beta [\delta_1 \ldots \delta_n]^{-1}$
        K $\leftarrow$ UD
        return K
    end function Algorithm 1 summarizes the method for determining $M^+$ from s what was derived in this section. In summary, it may be used in the following manner.

1) Attach a reference load which draws a constant current of $\beta$ to each conductor of the instrumented cable in turn.
2) Call the function CALIBRATE (S, $\beta$), where s is a range of sensor data that includes all of the reference load runs. The result is the matrix $M^+$.
3) To perform regular monitoring of currents, multiply the sensed magnetic field s(t) by $M^+$ on the left to obtain the current i(t).

HI. Alternating Currents

The calibration algorithm is next extended to the case of AC systems. The same algorithm that was developed for DC systems is applied to the Fourier transform of the AC sensor data. An important difference is that the Fourier transform is complex-valued and includes both magnitude and phase information. In this section, it is still assumed that an unmonitored conductor carries the return currents and that a modulated reference load is used for calibration. The AC reference load is a resistive device, i.e., when it is switched on it draws an alternating current that is in phase with the applied voltage.

The Fourier transform F is defined by $$(F_y(f))(t) = \sqrt{2} \int_0^1 f(t - T_\tau) e^{2\pi s j \tau} d\tau \quad (9)$$

where T denotes the period of the alternating current. In other words, $F_y(f)$ is the yth Fourier coefficient of f over a sliding window with a length of one period. The normalization factor is chosen so that the magnitude of $F_y(f)$ is equal to the RMS amplitude of the corresponding sinusoid.

The power transmission over one period is defined as $$p_x(t) = F_1(v_x)(t) \cdot \overline{F_1(i_x)(t)}.$$

where the real part of $p_x$ is the real power transmitted on the xth conductor and the imaginary part of $p_x$ is the reactive power on the xth conductor. Suppose that the phase of the voltage $v_x(t)$ on the ith conductor is $\theta_x$, so that $$v_x(t) = A_x \cos(2\pi t/T + \theta_x).$$

The amplitude of Ax is known in advance, so the calibration procedure is only responsible for determining the rotated current $$c_x(t) = \frac{p_x(t)}{|\mathcal{F}_1(v_x)(t)|} = e^{2\pi j t/T + j\theta_x} \cdot \overline{\mathcal{F}_1(i_x)(t)}.$$

This equation can be written in vector form as $$c(t) = e^{2\pi j t/T} \cdot \Theta \cdot \overline{F_1(i)(t)} \quad (10)$$

where $$\theta = \begin{bmatrix} e^{j\theta_1} & & 0 \\ & \ddots & \\ 0 & & e^{j\theta_x} \end{bmatrix}.$$

It happens that c(t) is directly related to the Fourier transforms of the sensed magnetic fields. There transforms are given by $$b(t) = e^{2\pi jt/T} \cdot \overline{F_1(s)(t)} \quad (11)$$

where $e^{2\pi jt/T}$ is a phase shift to compensate for the alignment of the transform window. Since $F_1$ is a linear operator, equation (1) implies that $$\overline{F_1(s)(t)} = M \cdot \overline{F_1(i)(t)}. \quad (12)$$

Combine (10), (11), and (12) to obtain $$b(t) = M\Theta'c(t) \quad (13)$$

and the inverse relation $$c(t) = \Theta M^+ b(t). \quad (14)$$

Equations (13) and (14) are analogous to (1) and (2) from the DC case.

In order to compute b from s, it is necessary to deduce $e^{2\pi jt/T}$ from measurements of the conductor voltages. (This prevents the inevitable problem of clock skew between the supposed time t and the actual phases of the voltages. Suppose that a capacitively-coupled noncontact voltage sensor 11 is used to measure an arbitrary mixture $v_m(t)$ of the conductor voltages. Since the time t may be shifted by any constant factor, suppose without less of generality that $v_m(t)$ is a zero phase signal. i.e.

$$\frac{\mathcal{F}_1(v_m)(t)}{|\mathcal{F}_1(v_m)(t)|} = e^{2\pi jt/T}. \quad (15)$$

Equations (11) and (15) are combined to obtain $$b(t) = \frac{\mathcal{F}_1(v_m)(t)}{|\mathcal{F}_1(v_m)(t)|} \cdot \overline{\mathcal{F}_1(s)(t)} \quad (16)$$

which allows b(t) to be determined without the need for a synchronized clock.

With this framework in place, an AC system is easily calibrated using algorithm 1:

1) Attach a reference load which draws a constant-amplitude sinusoidal current of β (in phase with the voltage) to each conductor of the instrumented cable in turn.
2) Use (16) to compute b over an interval of time which includes a) I runs of the reference load.
3) Call the unction CALIBRATE(b, β). The result is the matrix $\theta M^+$ on the left to obtain the desired output c(t)
4) To perform regular monitoring of currents, compute b(t) from s(t) using (16). Then multiply by $\theta M^+$ on the left to obtain the desired output c(t).
In other words, the DC calibration procedure seamlessly handles AC phase shifts when it is applied to complex-valued signals.

IV. Return Currents

This section extends the DC and AC calibration algorithms to the common case where the currents through the multiple-conductor cable are required to sum to zero. For example in residential AC distribution systems, any current drawn through one of the line conductor is returned through a neutral conductor. The reference load now draws a current from one conductor and returns it through a second conductor.

We begin by considering the DC case. Suppose that $i_1(t), \ldots, i_{n-1}(t)$ are the supply currents and $i_n(t)$ is the return current. The reduced-length vector is defined by $$i_r(t) = \begin{bmatrix} i_1(t) \\ \vdots \\ i_{n-1}(t) \end{bmatrix}.$$

and includes the supply currents but not the return current. Using the constraint that $i_1(t) + \ldots + i_n(t) = 0$, $$i(t) = H i_r(t) \quad (17)$$

where $$H = \begin{bmatrix} 1 & & 0 \\ & \ddots & \\ 0 & & 1 \\ -1 & \ldots & -1 \end{bmatrix}.$$

Combine (1) and (17) to obtain $$s(t) = MH i_r(t) \quad (18)$$

and the inverse relation $$i_r(t) = (MH)^+ s(t). \quad (19)$$

This is the same setup needed to apply algorithm 1:
1) Attach a reference load which draws a constant current of β to each supply conductor in turn. The return conductor always returns a current of –β;
2) Call the function CALIBRATE(s, β), where s is a range of sensor data that includes all of the reference load runs. The result is the matrix (M H
3) To perform regular monitoring of currents, multiply the sensed magnetic fields s(t) by (M H)$^+$ on the left to obtain $i_r(t)$.

The only difference when a return conductor is present is that the result of calibration is $i_r$ instead of i.

The method is similar for the AC case. Analogous to (10), define the reduced-length rotated currents $$c_r(t) = e^{2\pi jt/T} \cdot \theta \cdot \overline{F_1(i_r)(t)}. \quad (20)$$

Combine (11), (18), and (20) to obtain $$b(t) = MH\theta' c_r(t) \quad (21)$$

and the inverse relation $$c_r(t) = \Theta(MH)^- b(t). \tag{22}$$

Once again, we apply algorithm I:
1) Attach a reference load which draws a constant amplitude current of β (in phase with the voltage) to each line conductor in turn. The neutral conductor always returns a current of amplitude β that is 180 degrees out of phase with the line voltage.
2) Use (16) to compute b over an interval of time which includes all runs of the reference load.
3) Call the function CALIBRATE{b, β}. The result is the matrix $\Theta(MH)^+$.
4) To perform regular monitoring of currents, compute b(t) from s(t) using (16). Then multiply by $\Theta(MH)^+$ on the left to obtain $c_r(t)$.

The only difference when a return conductor is present is that the result of calibration is $c_r$ instead of c.

V. AC Delta-Connected Systems

In the special case of AC delta-connected power distribution systems, the conductor currents are required to sum to zero, but there is no designated return conductor and none of the conductors are at zero potential.

A reference load is attached between two line conductors, and draws a current that is in phase with the difference between the two voltages but out of phase with either of the individual voltages.

For example, consider a three-phase system. The voltages on all three conductors have the same amplitude, but the voltages on any pair of conductors are separated in phase by 120 degrees. Suppose that $\varphi_x$ is the phase of the voltage signal $v_x(t)$, $\theta_1$ is the phase of the difference $v_1(t)-v_3(t)$, and $\theta_1$ is the phase of the difference $v_2(t)-v_3(t)$ A reference load is first attached between conductors 1 and 3 and then between conductors 2 and 3. The previous algorithm for AC systems produces $c_r$ according to (20), where $$\theta = \begin{bmatrix} e^{j\theta_1} & 0 \\ 0 & e^{j\theta_2} \end{bmatrix}.$$

How desired result in this special case is $$c(t) = e^{2\pi jt/T} \cdot \Phi \cdot \overline{F_1(i)(t)} \tag{23}$$

where $$\Phi = \begin{bmatrix} e^{j\phi_1} & 0 & 0 \\ 0 & e^{j\phi_2} & 0 \\ 0 & 0 & e^{j\phi_3} \end{bmatrix}.$$

Equations (17), (20), end (23) are combined to obtain $$c(t) = \Phi H \Theta' \cdot c_r(t). \tag{24}$$

It follows from (22) and (24) that $$c(t) = \Phi H(MH)^+ \cdot b(t). \tag{25}$$

Therefore way of performing three-phase delta calibration is to determine the matrix $\Phi H\theta'$, which is then multiplied by $\Theta(MH)^+$ (the result of the previous AC calibration algorithm) to obtain the matrix $\Phi H(MH)+$ which recovers c(t) from b(t). In a three-phase system, the voltages on any pair of conductors have the same amplitude but are separated in phase by 120 degrees. Thus there are only two possibilities for the phase relationships between the three voltages:

$$e^{j\phi_1}/e^{j\phi_3} = e^{\pm 2\pi j/3}$$
$$e^{j\phi_2}/e^{j\phi_3} = e^{\mp 2\pi j/3}$$
$$e^{j\phi_1}/e^{j\phi_3} = e^{\pm 5\pi j/6}$$
$$e^{j\phi_2}/e^{j\phi_3} = e^{\mp 5\pi j/6},$$

and $$\Phi H\theta' = \begin{bmatrix} e^{\pm \pi j/6} & 0 \\ 0 & e^{\mp \pi j/6} \\ e^{\mp \pi j/6} & e^{\pm \pi j/6} \end{bmatrix}. \tag{26}$$

All that remains is to determine which signs the exponents take.

Observe that $\Phi H(MH)+$ is the product of a diagonal matrix $\Phi$ and a real-valued matrix $H(M H)+$. Thus every row of $\Phi H(MH)+$ is equal to a complex scalar times a real row vector. However, if the incorrect choice of $\Phi H\theta'$ is made, the last row of the incorrect $\Phi H(MH)+$ cannot be expressed as a complex scalar times a real row vector. This provides a mechanism for deducing the correct value of $\Phi H\theta'$.

The function $$r(w) = 1 - \left| \sum_{x=1}^{k} \frac{w_x^2}{\|w\|^2} \right|^2 \tag{27}$$

is equal to 0 if and only if the vector w has elements $w_x$ which are all real multiples of a single complex number, and increases with the angle between the vector's elements in the complex plane. The function r is applied to the two candidates for the bottom row of $\Phi H(MH)+$, and whichever one is closer to zero indicates the correct. choice of $\Phi H\theta'$.

In summary, calibrating a three-phase delta-connected system proceeds as follows:

1) Attach a reference load which draws a constant-amplitude current of β (in phase with the applied voltage) between conductors 1 and 3 and then between conductors 2 and 3.
2) Use (16) to compute b over an interval of time which includes all runs of the reference load.
3) Call the function CALIBRATE(b, β). The result is the matrix $\Theta(MH)^+$.
4) Use (26) and (27) to determine the correct value of the matrix $\Phi H\theta'$.
5) Form the product $$\Phi H(MH)^+ = \Phi H\theta' \cdot \Theta(MH)^+.$$

6) To perform regular monitoring of currents, compute b(t) from s(t) using (16). Then multiply by $\Phi H(MH)^+$ on the left to obtain c(t).

If (26) and (27) do not clearly indicate which is the correct value of $\Phi H\theta'$, then the initial assumption of symmetric three-phase power distribution was incorrect.

VI. Eliminating the Reference Load

In some cases, it is not feasible to attach a special calibration device to each conductor. In a typical energy monitoring application, most of the calibration process can be carried out "implicitly" using only the standard electrical devices which are already attached to the conductors. The former requirement that each $\sigma_x$ is equal to $\beta$ times a column of M is relaxed to allow each $\sigma_x$ to be an arbitrary scalar times a column of M. Thus each $\sigma_x$ can be the change in magnetic field due to an arbitrary load switching on, rather than just the change in magnetic field due to a known reference load switching on.

However, the demodulation scheme is no longer applicable for separating the magnetic field due to a particular load from the magnetic fields due to background loads which are operating simultaneously. Instead, s(t) is passed through a high-pass filter and the local extrema of the resulting signal are adopted as the new $\sigma_x$. Since it is very unlikely for independent loads attached to different conductors to switch on or off at exactly the same instant, these values of $\sigma_x$ indeed represent separate columns of M. The revised calibration procedure is given in algorithm 2.

Implicit calibration differs from standard calibration in that (i) p may be much larger than n, and (ii) the vectors D $\sigma_x$ in a cluster may have different magnitudes. The former is not important because the eigendecomposition and clustering algorithms scale well to larger datasets. The latter means that U and K can only be determined up to a constant scaling factor multiplying each row. However, in any building that is outfitted with a low-bandwidth utility-provided power meter, the non-contact sensor measurements may be compared with the utility's power measurements over a longer period of time in order to determine the unknown scaling factors.

---

Algorithm 2 Implicit calibration (without a reference load) for direct currents with external path for return current.

---

Require: the majority of step changes present in s are
    scaled columns of some matrix M, and all columns
    of M are represented by step changes.
Ensure: K is the pseudoinverse of M, up to a permutation
    of its rows and constant scaling factor applied
    to each row.
    function IMPLICITCALIBRATE(s, β)
      ŝ ← HIGHPASSFILTER(s)
      σ. ← FINDLOCALEXTREMA(ŝ)
      Σ ← [σ$_1$ ... σ$_p$]
      λ., ρ. ← EIGENDECOMPOSITION(ΣΣ')
      n ← COUNTNONZERO(λ$_1$,..., λ$_k$)
      D ← [ρ$_1$ ... ρ$_n$]'
      δ. ← SPECTRALCLUSTER(Dσ$_1$, ..., Dσ$_p$)
      U ← β [δ$_1$ ... δ$_n$]$^{-1}$
      K ← UD
      return K
    end function

VII. Results and Conclusion

In any real application of non-contact sensors, it is impossible to know the matrices M or θ in advance. This portion begins with a numerical example so that the calibration procedure can be tested with full knowledge of the unknown parameters.

Suppose that there are three sensors instrumenting a household service entrance cable with two high-voltage conductors and a neutral return, such that the sensor matrix is given by $$M = \begin{bmatrix} 0.5 & 0.3 & 0.7 \\ 0.3 & 0.5 & 0.7 \\ 0.4 & 0.4 & 0.8 \end{bmatrix}.$$

This poorly-conditioned matrix is typical of service entry cable with a braided neutral conductor surrounding the line conductors.

Further suppose that the line voltages are $2\pi 3$ radians apart, and the reference phase is 0.5 radians behind the first conductor voltage, so that $$\theta = \begin{bmatrix} e^{-0.5j} & 0 \\ 0 & e^{2\pi j/3 - 0.5j} \end{bmatrix}.$$

The reference load is run four times (twice on each conductor). Each time, it draws an RMS current of $\beta=2.2$ A between a line conductor and neutral. If the reference load signature $\sigma_x$ corresponds to the yth conductor, then we simulate $$\sigma_x = \beta e^{-j\theta_x} M(i_y - i_3) + n_x \quad (28)$$

wherein $n_x$ is a randomly generated complex noise vector that is scaled to perturbed each $\sigma_x$ by about 2%. Equation (28) is applied to obtain $$\sigma_1 = \begin{bmatrix} +0.01 + 0.86j \\ -0.01 + 0.43j \\ +0.01 + 0.87j \end{bmatrix} \quad \sigma_2 = \begin{bmatrix} -0.39 - 0.22j \\ -0.78 - 0.44j \\ -0.76 - 0.43j \end{bmatrix}$$

$$\sigma_3 = \begin{bmatrix} 0.39 - 0.20j \\ -0.78 - 0.43j \\ -0.80 - 0.42j \end{bmatrix} \quad \sigma_4 = \begin{bmatrix} +0.04 + 0.90j \\ +0.02 + 0.45j \\ +0.02 + 0.87j \end{bmatrix}.$$

The goal of calibration is to determine the matrix $\Theta(MH)^+$, which is equal to $$\begin{bmatrix} +1.81 - 0.99j & -2.58 + 1.41j & -0.52 + 0.28j \\ +0.07 - 2.94j & -0.05 + 2.06j & -0.01 - 0.59j \end{bmatrix}.$$

However, this matrix must be determined using only the quantities $\sigma_1$, $\sigma_2$, $\sigma_3$, $\sigma_4$, and $\beta$.

First assemble the $\sigma_x$ into Σ and compute $$\Sigma\Sigma' = \begin{bmatrix} 1.94 & 1.57 - 0.02j & 2.32 - 0.02j \\ 1.57 + 0.02j & 1.98 & 2.35 + 0.02j \\ 2.32 + 0.02j & 2.35 - 0.02j & 3.09 \end{bmatrix}.$$

The eigenvalues of ΣΣ' are 6.62, 0.40, and 0.001, so n=2.
From the eigendecomposition of ΣΣ', D is given by $$\begin{bmatrix} -0.51-0.00j & -0.52+0.01j & -0.68+0.01j \\ +0.71+0.00j & -0.70+0.02j & -0.00-0.00j \end{bmatrix}.$$

The clustering algorithm assigns $D\sigma_1$ and $D\sigma_4$ to the first cluster and $D\sigma_2$ and $D\sigma_3$ to the second cluster, with cluster centers $$\delta_1 = \begin{bmatrix} -0.03-1.27j \\ +0.01+0.32j \end{bmatrix} \quad \delta_2 = \begin{bmatrix} +1.14+0.01j \\ +0.28+0.15j \end{bmatrix}.$$

Therefore $$U = \beta [\delta_1 \quad \delta_2]^{-1} = \begin{bmatrix} -0.02+0.85j & +0.11-3.52j \\ +0.76-0.41j & +3.06-1.62j \end{bmatrix}$$

and the matrix UD is equal to $$\begin{bmatrix} +0.09-2.95j & -0.02+2.03j & -0.00-0.57j \\ +1.80-0.95j & -2.51+1.40j & -0.54+0.28j \end{bmatrix},$$

which differs from the true value of $\Phi(MH)+$ by about 2%. This deviation is caused by the noise added to $\sigma_x$. The rows are permuted because the order of clusters is determined arbitrarily, i.e. the two line conductors have no inherent ordering.

Figure 19:
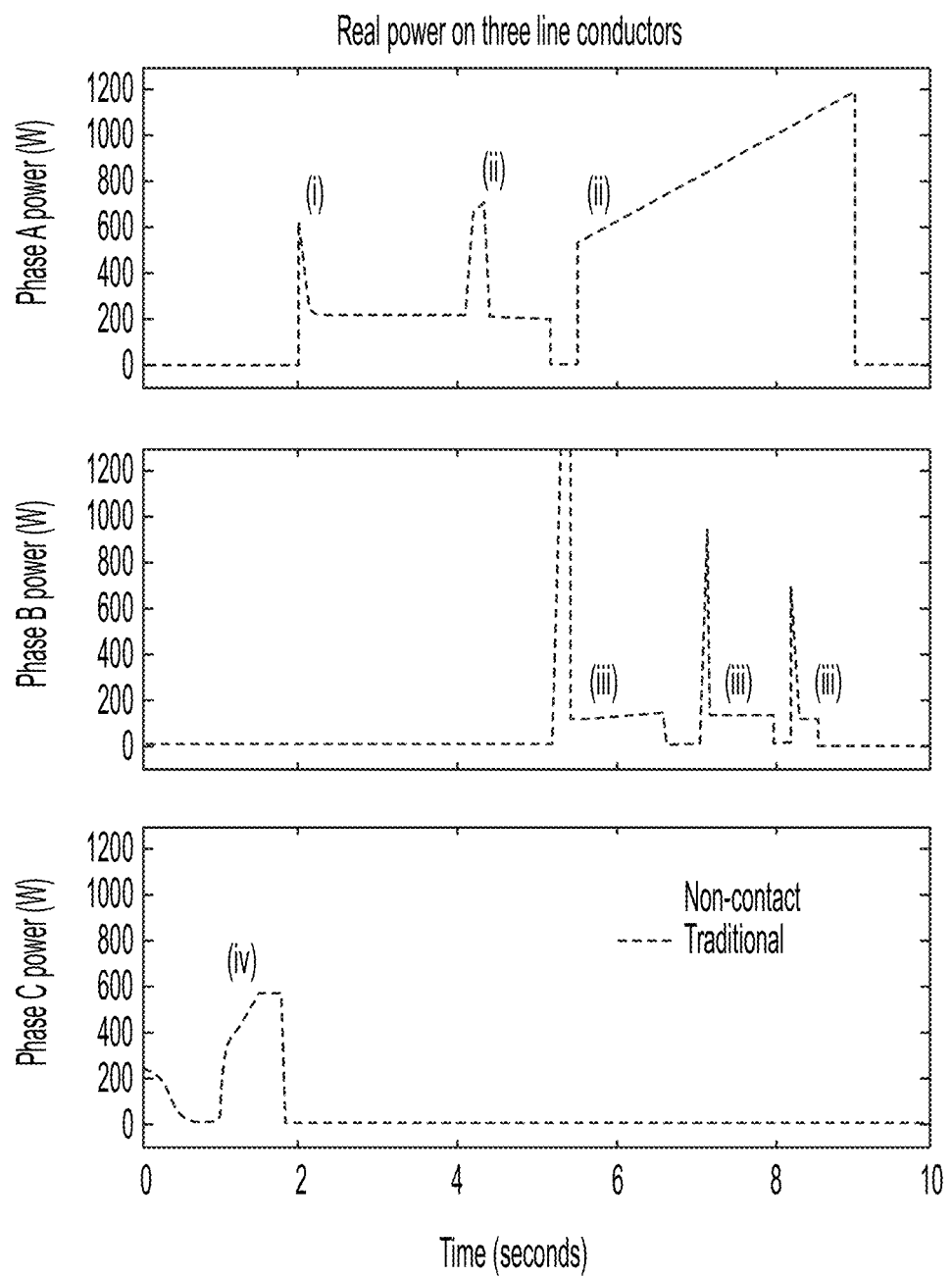
FIG. 19 shows the traditional power measurements and the non-contact power measurements agree to within 1% over a dynamic range of 1000 W.

For a physical test of the calibration algorithm, noncontact and traditional power meters were installed on an AC service entrance cable with an internal return conductor. The non-contact sensors were calibrated using algorithm 1 and various loads were attached to each of the three line conductors. The results of this experiment are plotted in FIG. 19. The traditional power measurements and the non-contact power measurements agree to within 1% over a dynamic range of 1000 W.

In conclusion, the algorithms introduced in this section permit easy installation and calibration of non-contact power meters. Knowledge of the wire and sensor geometry is not required in order to obtain accurate results.

Energy Box

Changes in the electric utility will necessitate new needs and opportunities for monitoring and controlling electric power consumption and generation. Technical solutions exploiting these opportunities and answering these needs would ideally preserve best practices like reliability, privacy, efficiency, and flexibility. A Nonintrusive Load Monitor (NILM) can serve as an ideal platform for constructing an "energy box" capable of sophisticated monitoring and control. This section introduces a data processing and analysis framework, NILM Manager. NILM Manager creates a business model for handling power data by minimizing network bandwidth and placing intelligence and feature expansion in easily transmitted "energy apps."

I. Introduction

"Electric utility" is a disarmingly simple phrase for one of mankind's greatest engineering achievements. In the heady rush for "disruptive transformations" and new business opportunities, we are perhaps especially well-served to consider the features and characteristics that underlie the pivotal importance of the grid. Proposed changes should be inspected closely with an eye on maximizing and preserving: privacy; flexibility and "future proofing" in permitting introduction of beneficial hardware; compatibility with conventional information infrastructure; and the availability of actionable information for conservation, resolving disputes, and ameliorating pathologies in support of grid operation. The utility should continue to seamlessly delight the customer by underpinning quality of life. The utility is here to serve its customers, not vice versa. It may well be that best-modes for a future smart grid avoid a requirement for an "Internet of Things" for utility operation. Poor hardware architectures may encourage the introduction of poor software. Poor software with wide reach could compromise load and load schedule diversity and hasten the introduction of opportunities for unplanned, correlated operation or events that have plagued other markets. As a bellwether of enthusiasm, note that tens of millions of "smart meters" have been installed in the United States alone. One might argue that these meters are severely limiting in many respects. They are relatively expensive compared to traditional meters. They typically compute sample data at rates of at most a few times per second, and produce data streams that are coarse for diagnostics and load identification. Yet, these data rates are sufficient to create a substantial burden on information or network bandwidth infrastructure when transmitted. They provide little in the way of "smart" analysis or data reduction, and create new burdens on distal processing sites for rendering the data actionable. The emerging vision of a "smart grid" relies on active distribution networks with new levels of both monitoring and control.

An energy controller or "energy box" can serve as a gateway for monitoring and control of loads and distributed generation assets in homes or buildings. This paper proposes and demonstrates an energy box built around a high performance, low cost computer that remains as a monitor at a site, a nonintrusive load monitor. Nonintrusive meters can measure power consumption and harmonic information by sampling at rates over 1 kHz. A NILM can identify exactly what loads are consuming power and provide the end user with an itemized summary of power usage. In this work, a NILM serves not only as a sophisticated monitor but also as a flexible controller informed by the nonintrusive monitoring algorithms. A custom high-speed time-series database, NilmDB, organizes data in the energy box for efficient retrieval, and a powerful visualization and programming interface, NILM Manager, permits secure reconfiguration and programming from anywhere in the world. NILM Manager supports scripts or "apps" that can take advantage of sophisticated math libraries stored with the NILM. With this architecture, remote nonintrusive meters do not need a dedicated work station for analysis. Raw data belongs to the facility owner and remains on the facility computer. Using NILM Manager, users can visualize power consumption, generate custom reports using an integrated scripting engine, and control loads using custom or commercially available intelligent switches. New capabilities can be installed on the box remotely with short, powerful scripts that update the function and utility of the NILM. The box exploits noncontact sensors that can be easily installed by unspecialized hands, and the entire facility monitor runs on a low-cost computer like a Raspberry Pi, for example. Demonstrations of this system and information architecture for flexible and reconfigurable monitoring and control are presented.

II. System Architecture

Recording current and voltage with enough resolution to identify load characteristics is performed by sampling at relatively high rates. NILM's capable of interesting diagnostics and load recognition typically generate very large data sets. Eq 1 can be used to estimate the storage requirements for a typical installation:

$$R = 2N_\varphi \times f_s \times B_{adc} \quad (1)$$

where R is the data rate in bytes per second, $N_\varphi$ is the number of phases (usually two for residential and three for industrial environments), $f_s$ is the sampling frequency, and $B_{adc}$ is the ADC resolution, or the number of bytes used to represent a sample measurement (optionally about two). The product of these factors is multiplied by two because both current and voltage waveforms are recorded for each phase. Using Eq 1, a NILM running at $f_s$=8 kHz will produce over 5 GB of data per day for a standard home. Data sets of this size are difficult to transmit over a residential network. In NILM's deployed in one study for example, equipment operators mailed hard drives and DVD's back to the lab for analysis. The cost in resources and person-hours make this type of installation impractical for all but the most limited deployment scenarios. Even if data can be reliably collected, plotting the current and voltage over a single day involves billions of individual samples which is beyond the capability of many standard software packages (such as commercially available spreadsheet software).

NILM Manager, a platform that enables quick and easy access to NILM data, solves the access and analysis challenges created by high bandwidth or "big data" power monitoring. A "remote" NILM is installed at a facility to be monitored. Desktop-power computing is readily available in "deck of cards" sized hardware that can be installed quickly at a site with terabytes of local storage, at prices comparable to those of a modern solid state electricity meter. Raw collected by this remote NILM is not fully transmitted from the site, minimizing network traffic. Rather, data is managed locally on the site computer by custom high-speed database software, such as NilmDB. NILM Manager provides a central management node that connects multiple remote NILM's with a virtual private network (VPN) and hosts a website that allows authorized users to view and analyze data collected by NILM systems.

A. NILM Virtual Private Network

NILM Manager controls the computing "center" of a virtual private network that securely connects remote NILM's, each running NilmDB, to the management node. The network is virtual in the sense that all communication occurs over the public Internet but is encrypted so only NILM's and the management node can decipher the content. Extensive computation on acquired data is relegated to local computing managed by NilmDB at a site. New programs or "energy apps" can be downloaded to a NilmDB installation. New analysis results can be uploaded from the remote site to NILM Manager for web presentation, which can be through secure connections. Small energy apps and small reports or analysis results, typically a few kilobytes, can provide full, powerful access to remote high bandwidth data with minimal network data requirements. A (low technology) cell phone can and has provided more than enough bandwidth for managing a full industrial monitor in our experiments.

Figure 20:
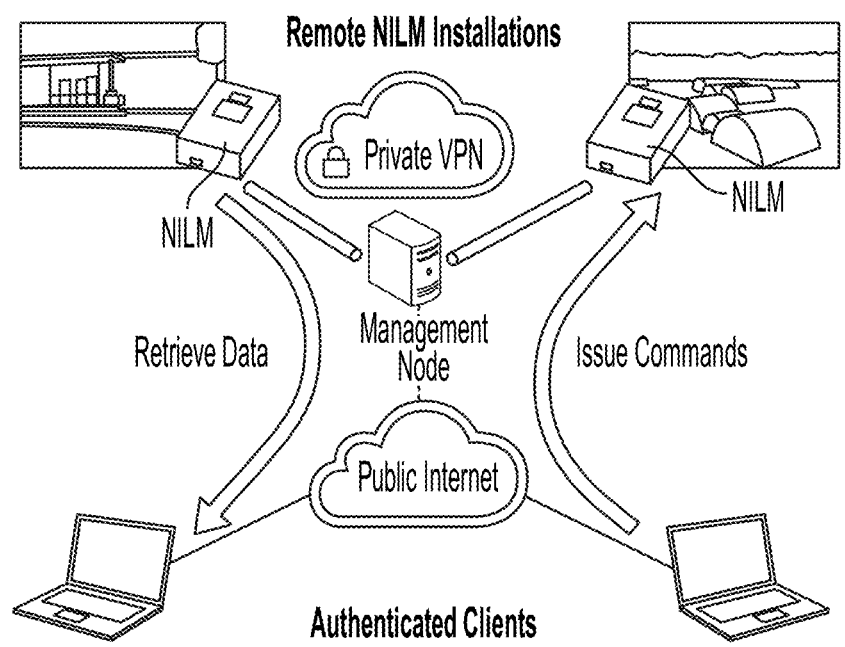
FIG. 20 shows a conceptual view of the NILM VPN.

FIG. 20 shows a conceptual view of the NILM VPN. Users can request data from a NILM and send it commands all without any physical access to the machine. The management node coordinates VPN traffic and ensures that only authorized users have access to NILM systems. FIG. 20 shows the NILM Manager system architecture. The management node relays requests from authenticated clients to remote NILM's over a secure VPN. Clients can issue commands and retrieve data over a web interface.

B. Web Platform

Users interact with NILM's though a website hosted by the management node. The website is available over the public Internet which means it is accessible from any connected device including tablets and cell phones. Users authenticate with a username and password although certificate-based authentication or other forms of protection could be implemented if additional security is required. By presenting users with a web interface rather than a direct connection (for example via SSH) to the remote meter, the user interaction tools (NILM Manager) are decoupled from NILM system tools. This means NilmDB and other backend software on the NILM can be updated without affecting how the user interacts with the NILM data.

C. Implementation

Figure 21:
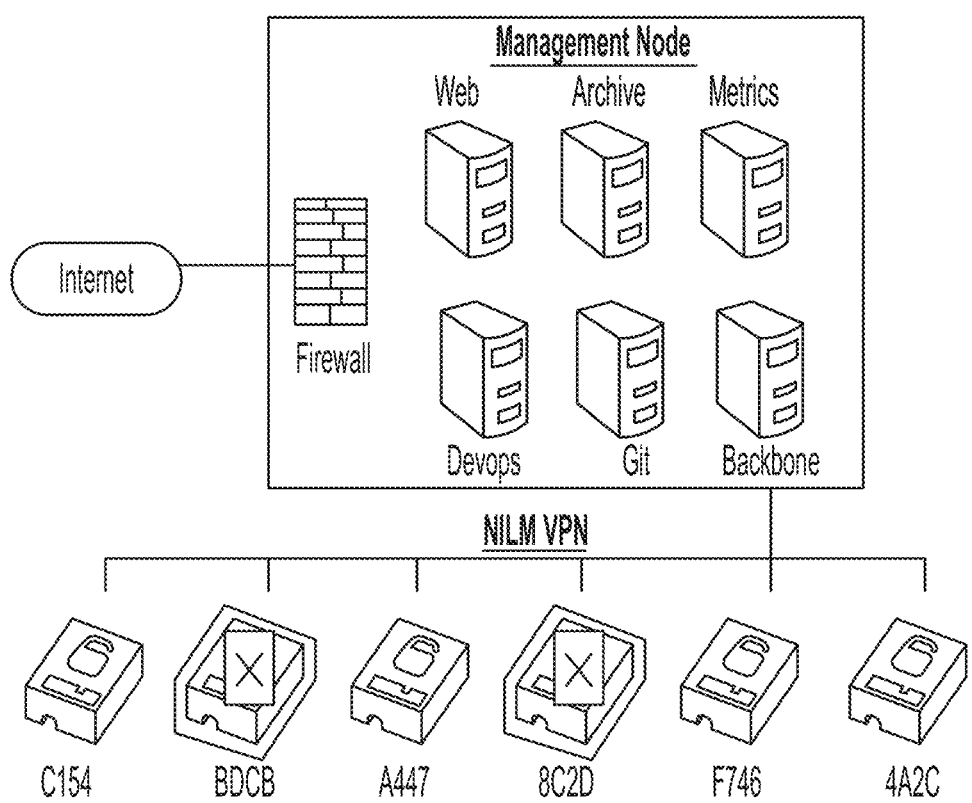
FIG. 21 shows NILM Manager may be a cluster of seven separate servers.

Creating a secure and reliable infrastructure to manage the remote energy monitors entails more than a web server with VPN software. NILM Manager may be a cluster of seven separate servers, illustrated in FIG. 21. These servers may work together to provide a complete suite of management tools. In our experimental implementation, these servers run as virtual machines (VM's) on two Dell R320 servers with Xen hypervisor. The VM's are paravirtualized Ubuntu 14.0 images. The servers are named according to their roles, described below.

Firewall: The firewall may be the only machine with a public network connection. Incoming traffic is analyzed against a set of rules that determines whether the particular packet is allowed and where it should be routed. The firewall VM does not run any services itself making it easier to secure against attack.

Backbone: The backbone manages communication between servers in the management node and remote NILM's. NILM's authenticate with the backbone using SSL certificates. Certificates (unlike passwords) can allow for two-way authentication meaning NILM's verify the identity of the management node and vice versa. This prevents impostor management nodes from accessing NILM's and rogue NILM's from accessing the management node. Once a NILM authenticates, the backbone assigns it an IP address and hostname which uniquely identifies it on the VPN. Other servers on the management node can access the NILM by requesting its IP address from the backbone using a domain name resolution service (DNS).

Web: The web server hosts the NILM Manager website. The firewall directs all inbound HTTP requests to this VM using port address translation. This protects the web server from unsolicited (and potentially malicious) traffic. One of the advantages to deploying the web server in a VM is that resources can be scaled with user demand. If web traffic increases, the Xen Hypervisor can reassign processor cores and memory to handle the additional load.

Metrics: Metrics may run Nagios and Ganglia monitoring services. Nagios periodically checks the health of remote NILM's and Ganglia provides a trending report of memory usage, CPU load, and other metrics for each NILM machine. This enables rapid detection and diagnosis of faults in deployed NILM systems. Additionally it provides profiling information that helps in designing hardware for future NILM's based on their real world usage.

Archive: Archive may hold NILM data for long term storage. This server is used to backup valuable data sets collected by deployed NILM's. The archive server is useful for testing and evaluating different data processing techniques as the machine has significant hardware resources as well as a reliable network, connection (neither of which can be assumed for remote NILM's).

Devops: Devops (a portmanteau of "development" and "operations") provides configuration management for remote NILM's. All of the settings, packages, and scripts needed by a NILM are stored on this server using Puppet, an open source management tool. Puppet automatically mirrors updates to these files to every NILM on the VPN ensuring they have consistent and up-to date configurations. Without such a service any update to a setting or script would have to be manually applied to each NILM—a tedious and error prone process. Git: This server hosts git repositories for all the software developed for NILM's and NILM Manager. Git provides version controlled storage and enables collaborative work on the NILM code base. Together these servers create a reliable and secure infrastructure for managing NILM systems. They permit access to remote database storage located at different monitoring sites. Visualizations or other results of data analysis can be returned from a remote monitor. Python or Octave-style analysis code can be transmitted to remote monitors to provide new analytical capabilities or requests. In both directions, network bandwidth is minimized, as large data streams never have to be transmitted from the remote monitoring sites. The next two sections describe how this infrastructure makes it possible to view and process almost unlimited amounts of NILM data with very little exchange of information over a network.

III. Data Visualization

One of the primary difficulties in Nonintrusive Load Monitoring is visualizing the high bandwidth data collected by the current and voltage sensors. A NILM produces thousands of data points each second. Tools such as Excel and MATLAB consume significant system resources to produce plots for datasets of this size. Complicating matters further. NILM's often have limited network bandwidth making transmission of the raw data to a workstation difficult or impossible. NILM Manager solves this problem by using a decimation algorithm to visualize large datasets.

A. Stream Configuration

Figure 22:
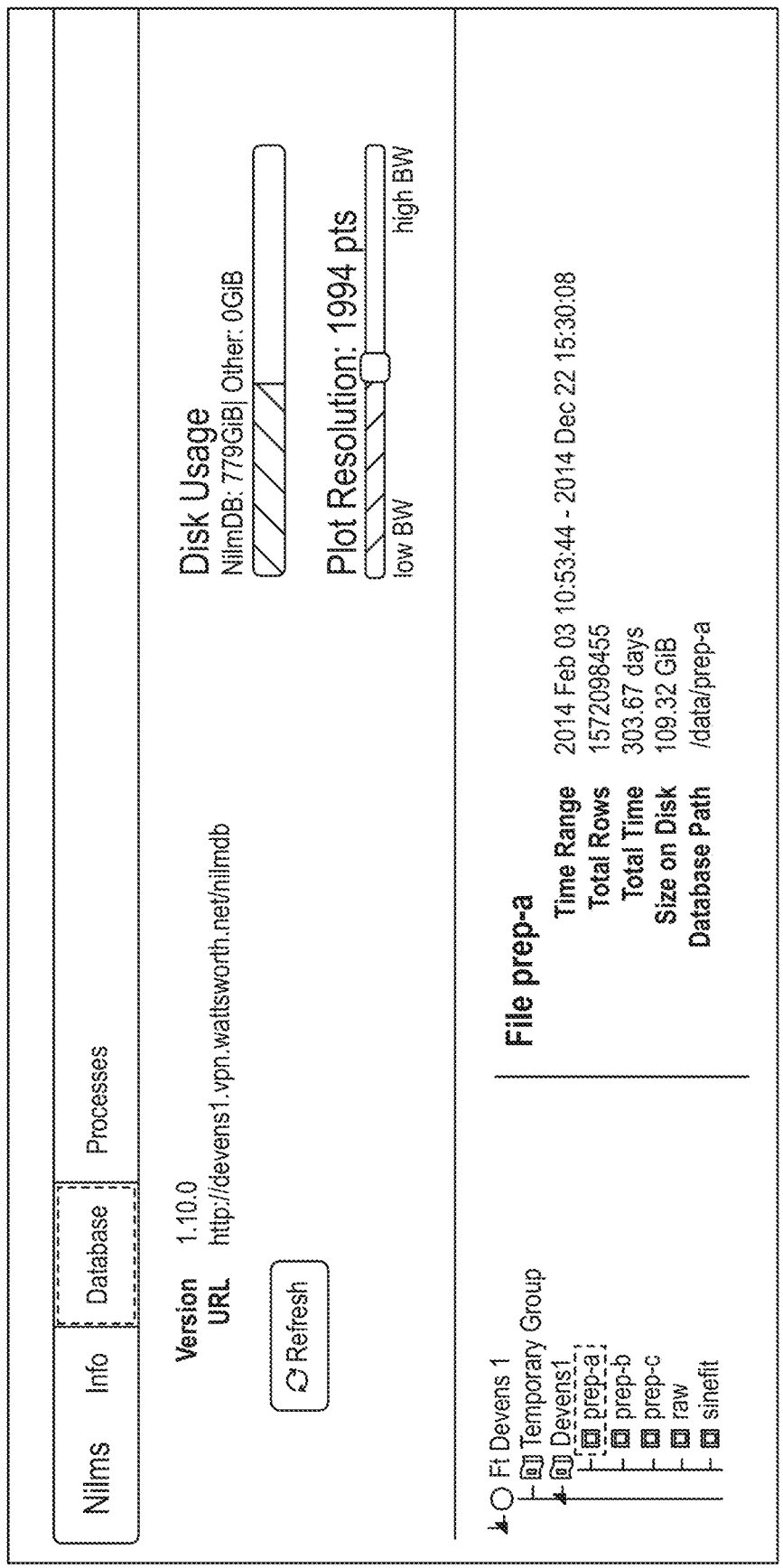
FIG. 22 shows an example of a web interface.

NILM's connected to the management node may be configured through the web interface shown in FIG. 22. The plot resolution slider controls how many data points are displayed in data visualization tool (shown in FIG. 23). This interface presents the data collected by the NILM as a series of files organized into directories. Users can navigate through the data on the NILM just as they would navigate folders on their desktop. While they appear as flat datatypes on the web interface, each file corresponds to a hierarchy of streams on the NILM itself. As the NILM adds data to a stream, it simultaneously computes a decimated child stream. For every four elements in the parent stream, the child contains a single [min, max, mean] tuple. This process is performed recursively with each successive child containing a factor of four fewer elements than its parent. When this process is carried out to completion (the final child containing only one sample), the total storage requirement only increases by a factor of two. The plot resolution slider in the top right of the interface sets the number of data points returned by the NILM when a user requests an interval of data. NILM Manager checks how many data points are contained in the requested interval and returns the lowest decimated child stream that fits within the configured plot resolution. The raw data is only returned if the interval requested is small enough that there are fewer raw samples than the plot resolution setting.

B. Presentation

Figure 23:
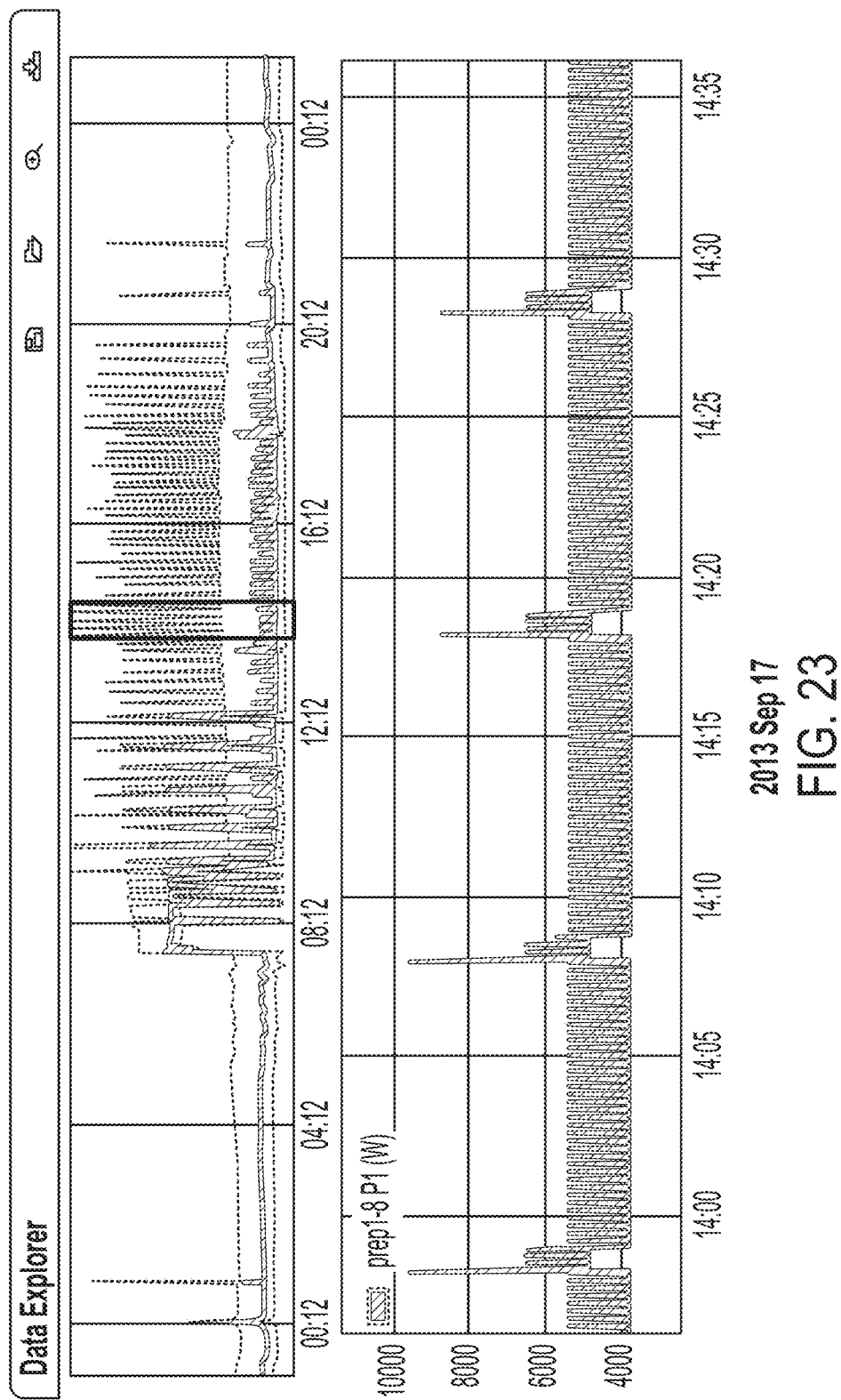
FIG. 23 shows data visualization using the web plotting tool.
Figure 24:
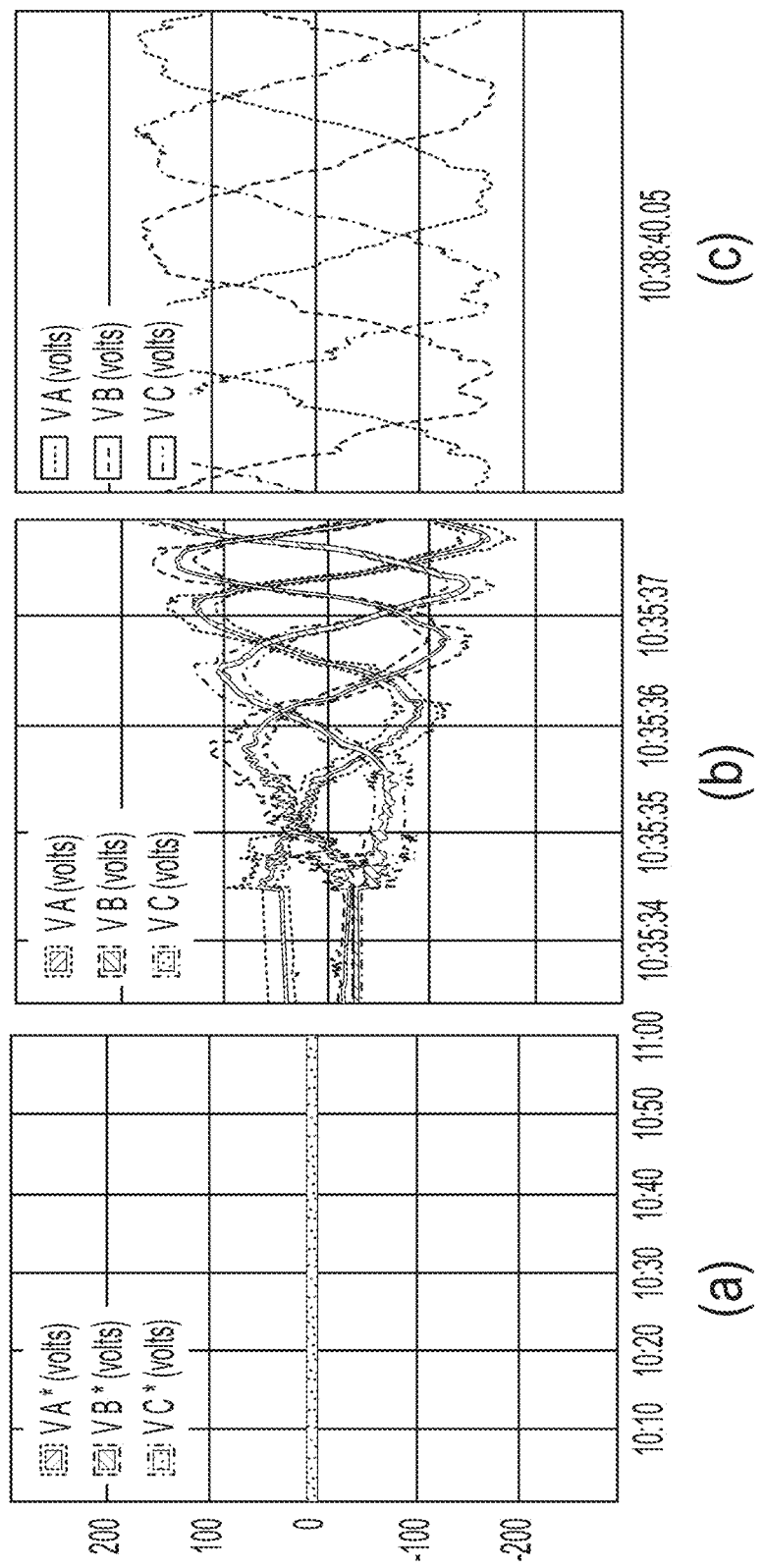
FIG. 24 shows the three plot display styles.

The NILM Manager website provides an intuitive plotting interface shown in FIG. 23. FIG. 23 shows data visualization using the web plotting tool. The upper plot shows 24 hours of power data and the lower plot shows a higher resolution view of the highlighted segment. This view represents 5.1 M samples but is drawn using just 2K decimated samples (less than 0.05% of the raw samples). Note that this figure shows real data from a monitoring site in our research program. The system has been running for nearly two years, and the remote monitor contains tremendously detailed data, down to the envelopes of individual electrical transients as shown in the figure. Nevertheless, access to this data is almost instantaneous from any web connection anywhere. The interface uses decimated streams to allow users to view any dataset from any remote NILM at any time scale. Panning and zooming through the data operates like Google Maps with progressively higher resolution data returned as a user "zooms in" to a particular area of a waveform. Progressive views are delivered essentially instantaneously. The plotting interface is implemented in Javascript which runs in the client browser. The code is based off the open source "Flot jQuery" plugin although it has been highly customized for this application. The plotting code has three display modes. If the time interval is short enough that the raw data fits within the plot resolution setting, a simple line graph is displayed. If, as is usually the case, the raw data contains too many samples, data from the selected decimation level is displayed as a [min,max] envelope around the mean which is plotted as a line graph. The envelope is the same color as the mean with added transparency. This provides feedback about the structure of the data without obscuring other time series on the same plot (as in the case of Matlab or Excel). Finally if a time interval contains too much data in all available decimation levels (which occurs when a NILM has not yet decimated a new stream), a thick horizontal line is drawn in place of the data and an asterisk is added to the legend indicating the inability to plot the particular stream at the selected time scale. FIG. 24 shows the three plot display styles. The NILM Manager automatically adjusts the plot type based on how many points are in the selected dataset. As shown in FIG. 24(a), when a stream has too much data and no available decimations a solid line indicates the plot cannot be displayed. As shown in FIG. 24(b), if decimations are available an envelope of the dataset is shown. FIG. 24(c) shows if the time interval is short enough, the raw data is plotted directly. The client code automatically switches between styles as the user navigates between datasets and timescales. The plotting interface provides several powerful manipulation tools. Two y-axes are supported (left and right) so that different data types can be easily displayed on the same plot (e.g. current and voltage). Each axis can be panned and zoomed independently so users can zoom in to a particular time while keeping the y-axes constant. As the user pans and zooms the client merges requests for new data so that no more than one request is pending at a time. A slightly larger time interval of data is returned with each request so that panning the plot will not reveal missing data. Once a user has panned out of the buffered section, the requested data has usually arrived to replace it. This presents the user with a seamless view of the entire NILM dataset, all without ever transmitting more than about a thousand data points at a time. Colors are automatically cycled and a legend is maintained next to each y-axis indicating the names of the datasets and the axis units. Data sets sharing an axis must have the same unit. The raw data backing a plot can be downloaded directly through the web interface (although very large datasets require an additional level of authorization as such actions can place a large burden on a remote NILM and its host network). Plots can also be saved and loaded making it easy to share particular views between users.

IV. Data Processing

Current smart meters typically transmit their measurements wirelessly to a central monitoring node which limits their resolution, as these links generally cannot carry sufficiently large amounts of data. Exposing raw data also exacerbates privacy concerns. The on-board CPU cores in even a low-cost NILM process data locally. Data need never be moved in bulk from the monitoring site. Short, actionable reports and analyses can be transmitted to a facilities manager or service provider as privacy restrictions permit. The information can also be used locally for control. Moving computation from a centralized server to a distributed embedded environment requires an efficient data processing framework. The following sections describe this framework, and illustrate how apps on distributed NILM energy boxes can analyze, report on, and control power systems.

A. Management and Preprocessor

NILM's may support remote management through a specialized application programming interface (API), which allows clients to upload and execute custom scripts. This API is exposed to the management node over HTTP with security provided by the VPN tunnel. The management node uses this API for system administration tasks such as database cleanup, software updates and system diagnostics. The management node establishes a sandbox on top of this API in which end users can execute their own scripts called "Energy Apps". These scripts use input hooks to link to data streams stored on the NILM. An app can use data from multiple streams each of which may have different intervals of data and sampling rates. The NILM runs a two stage preprocessor that consolidates input data from diverse source streams into a single time stamped array which makes it easier to write energy processing algorithms.

1. Multistream Wrapper: Data streams may be electrical measurements, data from secondary sensors, or outputs from other NILM processes. For processes that require inputs from multiple streams care must be taken to schedule the process appropriately and only run it over time intervals where all of its input streams are available. Sensor data may arrive in bursts with significant lag, and streams produced by other processes create scheduling dependencies. The multistream wrapper manages these dependencies and ensures that a process is only run over intervals where its inputs are available.

2. Resampler: Once the input streams have been assembled, the resampler produces a single composite data set with timestamped rows where each column is a process input. If all inputs come from a common source stream then this array is straightforward to assemble, however apps using inputs from different streams generally require resampling. For example, an app that uses outside temperature and real power consumption as inputs (to compute energy usage as a function of weather for example) may use either down-sampled energy measurements or up-sampled temperature measurements. When multiple streams are used as inputs the user specifies a "master" stream and resampler runs a linear interpolator or a decimator on the other inputs to create a uniformly sampled dataset. The stream iterator framework makes it easy to write custom applications that use this dataset to run analysis and control algorithms.

B. Stream Iterators

Each "energy app" may be based around a stream iterator which enables computation on large NILM datasets. Traditional iterators such as for and while loops operate on static datasets, but NILM data arrives continuously. Stream iterators provide the ability to operate on continuous datasets by combining a traditional looping iterator with a persistent state. When the stream iterator has finished processing the available data it saves its state variables so that when it runs on the next chunk of data, it can pick up exactly where it left off. This allows the programmer to treat the datasets as continuous streams while giving the NILM flexibility to choose chunk size and processing rate based on the available system resources. Building a stream iterator is a two step process. First, the user defines a set up function (see Listing 1). This function initializes a state object which provides persistent storage between process runs. Data is stored in slots which are accessed by string identifiers, similar to a dictionary. This function only runs the first time the app is executed. The setup function in Listing 1 initializes state for an example app which runs a linear filter on a NILM data stream.

| Listing 1: The setup function for a NILM stream iterator |
| --- |
| 1    a = [...]; b = [...] #filter coeffs |
| 2    def setup(state): |
| 3        z1 = [...] #initial state for filter |
| 4        state.initializeSlot("filter_zi.",zi) |

The filter coefficients do not need to be stored in state because they are constants which do not change between runs of the process. After initializing the app state in setup, the user then defines a run function. This function receives the resampled input streams from the preprocessor and performs the actual data processing (see Listing 2).

| Listing 2: The run function for a NILM stream iterator |
| --- |
| 1    #data is 2 column array: [timestamp, sample] |
| 2    def run(data, state, insert): |
| 3        #initialize filter with saved zi values |
| 4        zi = state,retrieveSlot("filter_zi") |
| 5        #run filter against this chunk of data |
| 6        (y, zf) #scipy.signal.lfilter(b,a,data[:, 1],zi=zi) |
| 7        data[:, 1]=y #update data in place |
| 8        insert(data) #save output |
| 9        state.saveSlot(zi, "filter_zi") #update zi |

In this function traditional iterators and third party libraries can be used to build complex signal processing algorithms. Listing 2 shows a simple example which runs a linear filter using SciPy, an open source Python library. More advanced code could perform load identification, equipment diagnostics or a variety of other data analysis. The insert argument is a function handle for saving results to an output data stream. After processing the input, any variables that should persist between runs are stored in the state object. The NILM repeatedly runs this function as more input data becomes available.

C. Reports

Figure 25:
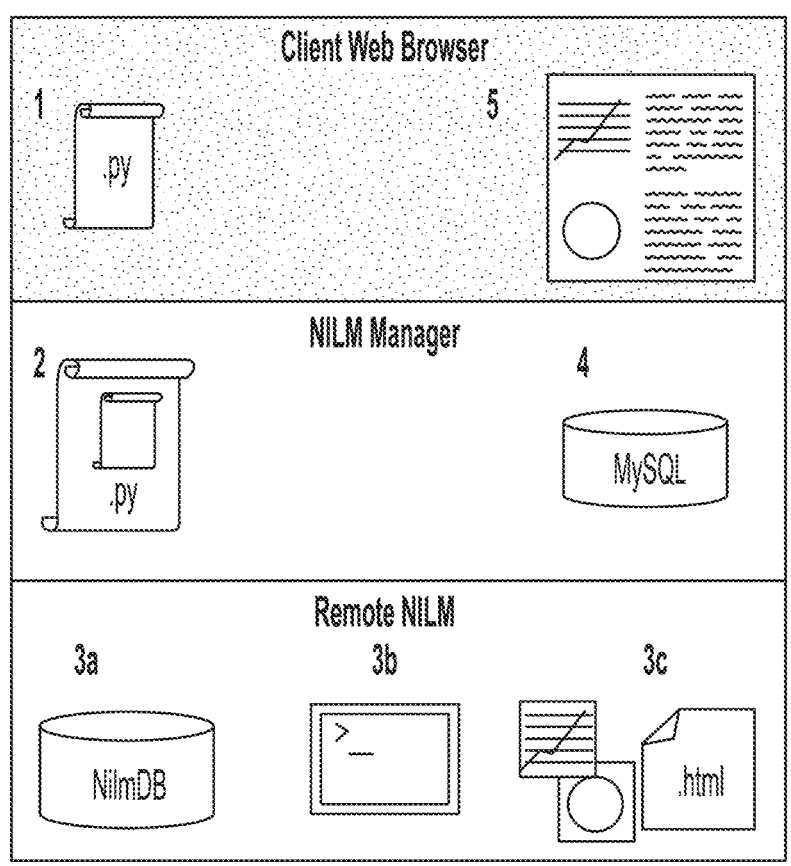
FIG. 25 shows the process of creating an energy app report.

In addition to generating output data streams (such as the filter example in Listings 1 and 2), "energy apps" can also produce reports. Reports run over a specific interval of data and produce an HTML document that can contain custom text, plots, and tables. After the stream iterator has processed the specified duration of data (e.g., hour, day, week, etc.), an HTML generator produces the report document. A report is defined by an analysis function and an HTML template. The analysis function uses the process state to compute summary statistics and figures. These are injected into the report template to create a full HTML document. FIG. 25 shows the process of creating an energy app report. In step 1, the user defines the stream iterator, analysis function, and HTML template. Next, the management node adds the support code making an executable script which is sent to the target NILM. In steps 3a-3c the NILM runs the energy app which generates an HTML document and associated figures. The NILM returns these files to the management which stores them in a MySQL database and makes them accessible through the web interface to authorized users. Hosting the report document on the management node rather than the NILM insulates the NILM from external network traffic providing an additional layer of security and reducing the demand for its limited bandwidth. If privacy is a greater concern than network bandwidth, the NILM can retain the report in local storage instead.

D. NILM Manager IDE

Figure 26:
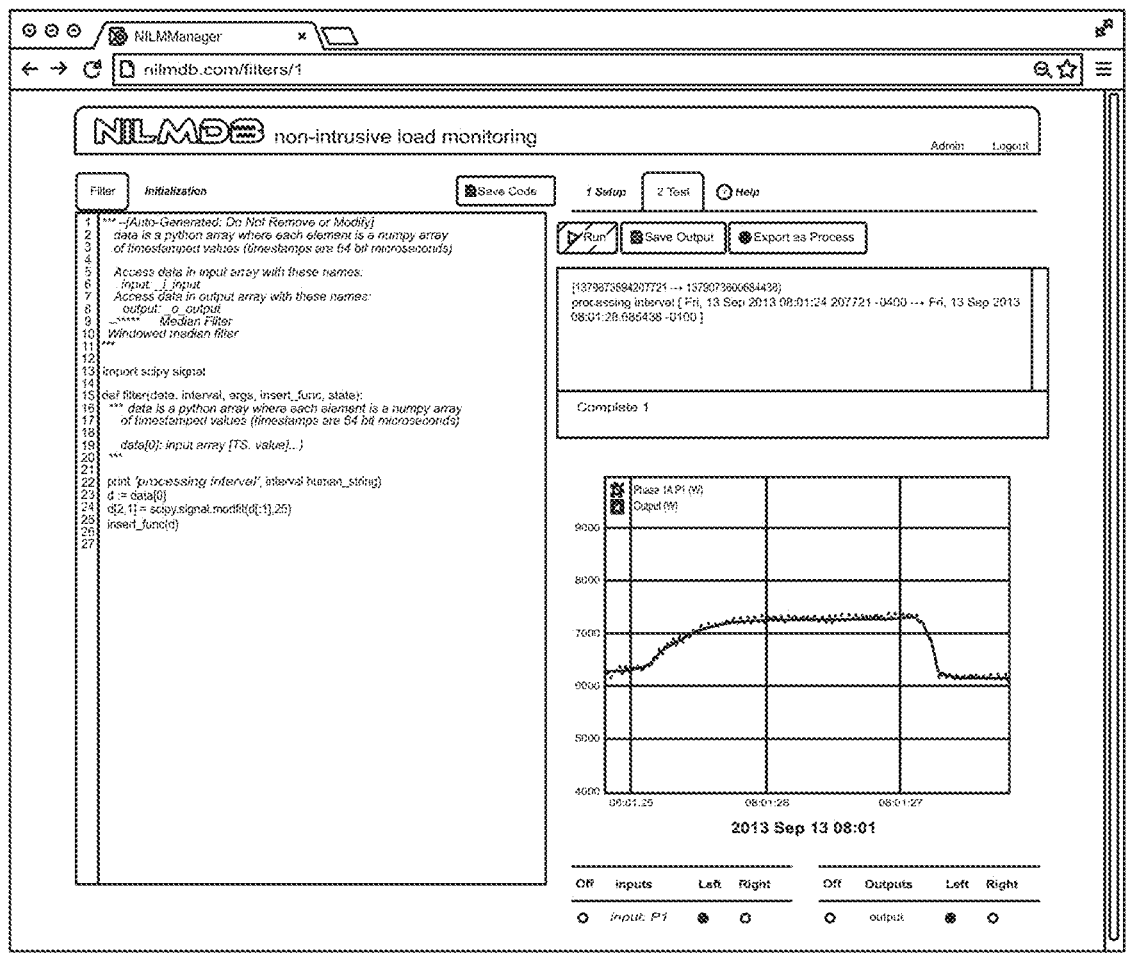
FIG. 26 shows the app designer interface.

The NILM Manager website provides a complete integrated development environment (IDE) to write, test, and deploy "energy apps". FIG. 26 shows the app designer interface. The left hand panel is a syntax highlighting code editor with multiple tabs for app initialization, stream iterator definitions, and report templates. To run the app in development mode the user selects input streams and a time range using the plotting window on the bottom right. Text output generated by the app is continuously retrieved from the NILM and displayed in the upper right hand panel. This panel also displays debugging information in the event of an error. In development mode the output stream is temporarily allocated on the remote NILM, and each time the app runs, it overwrites the previous output. Once the user is satisfied with the app's performance, the code can be deployed to one or more target NILM's and scheduled as a continuous process. The management node tracks deployed processes and archives system logs and metrics so that users can manage the computational resources on their NILM's appropriately. When an app is deployed in production mode its output stream is permanently allocated on the target NILM and made available to other users either to plot or use as an input to other apps.

V. Designing Energy Apps

Users with appropriate security permissions can now design useful applications on the NILM to monitor and control their power systems. "Energy apps" run entirely on the NILM itself and do not rely on external services or high bandwidth network connections. The following example shows examples of how these apps are designed at real monitoring sites.

A. Cycling System App

Figure 27:
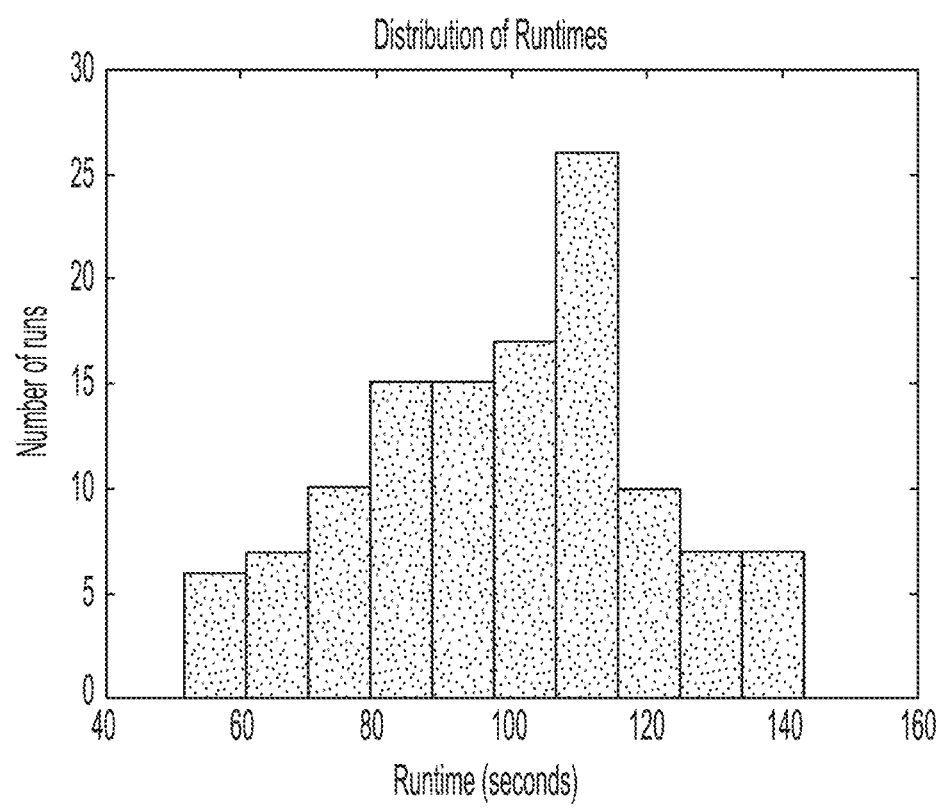
FIG. 27 shows an example of a report for tracking trends in air compressor runtime.

Reports present actionable information to end users turning NILM's into powerful monitoring and diagnostic tools. Consider a standard cycling system such as a shop air compressor. This system requires periodic maintenance based on hours of operation and excessive runtimes may indicate leaks or abnormal usage, but adding sensors to track air compressor runs is generally too expensive for the benefit it provides. NILM is the cost effective solution. A single NILM can monitor multiple air compressors, and indeed any electric machine in a shop, eliminating costly (and maintenance-prone) sensor networks. FIG. 27 shows an example of a report for tracking trends in air compressor runtime. The report is built in two stages. First a stream iterator, defined by setup and run functions, processes data over a specified time interval. The stream iterator identifies machine turn on and turn off events by tracking transients in the power waveform. When a machinery run is detected it is added to an array stored in the process state. After the stream iterator processes the data, the analysis function in Listing 3 generates summary statistics and builds a histogram of machine runtimes.

Listing 3: The analyze function for a report process

```
1    def analyze(state, save_fig):
2        #retrieve date calculated by [run] function
3        runtimes = state.retrieveSlot("runtimes")
4        #calculate statistics
5        mins = int(np.sum(runtimes)/60) #minutes
6        state.initializeSlot("time",mins)
7        state.initializeSlot("runs",len(runtimes))
8        #if any runtime > 3 hours raise alarm
9        if(np.max(runtimes)>180)
10           state.initializeSlot("status",
11              "maintenance required")
12       else
13           state.initializeSlot("status","OK")
14       #make a histogram of the runtimes
15       fig = plt.plot(runtimes)
16       save_fig("runtime_histogram",fig)
17       #...additional plot formatting not shown
```

The statistics are added to the process state, and the saveFigure function saves the plot using a similar string-tag syntax. Finally the HTML generator builds the report using the template shown in Listing 4. Markdown is used for simplicity although raw HTML and CSS can be mixed in for finer grained control of the document format. Content from the process state is injected into the template using double braces {{•,•}}, and the insertFigure command embeds plots as HTML images. The HTML document and plot image are sent back to the management node and hosted through the web interface. Reports like this example can be scheduled to run once or run continuously. When set for continuous operation the user specifies a repeat interval and duration. For example a report can be set to run every hour using the past 24 hours of data. The web interface provides a navigation tool to browse series of reports which can be help identify trends and spot abnormalities in equipment operation.

B. Power Quality App

Figure 29:
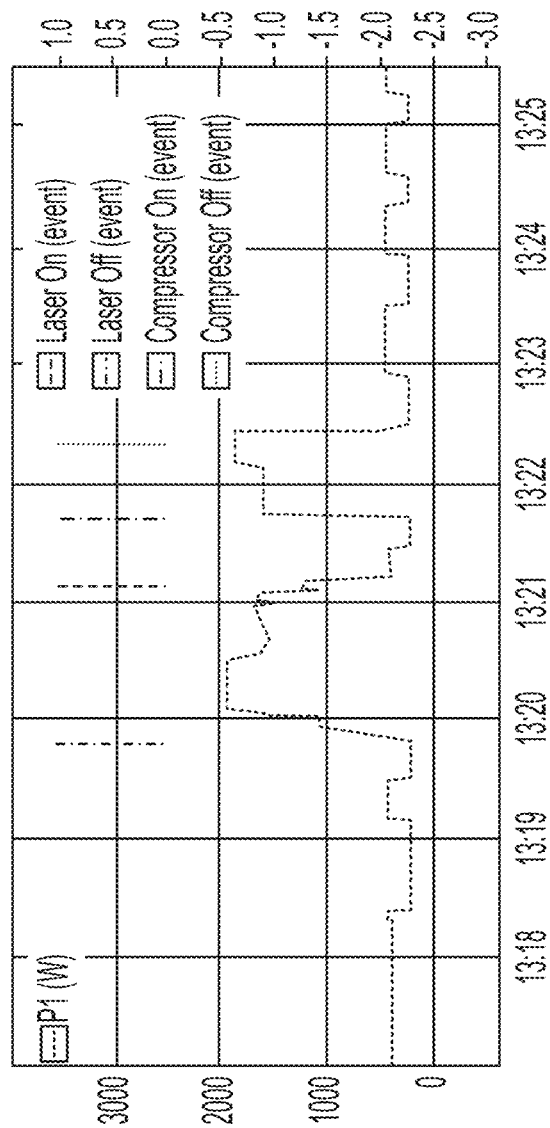
FIG. 29 shows a power cycling waveform.
Figure 30:
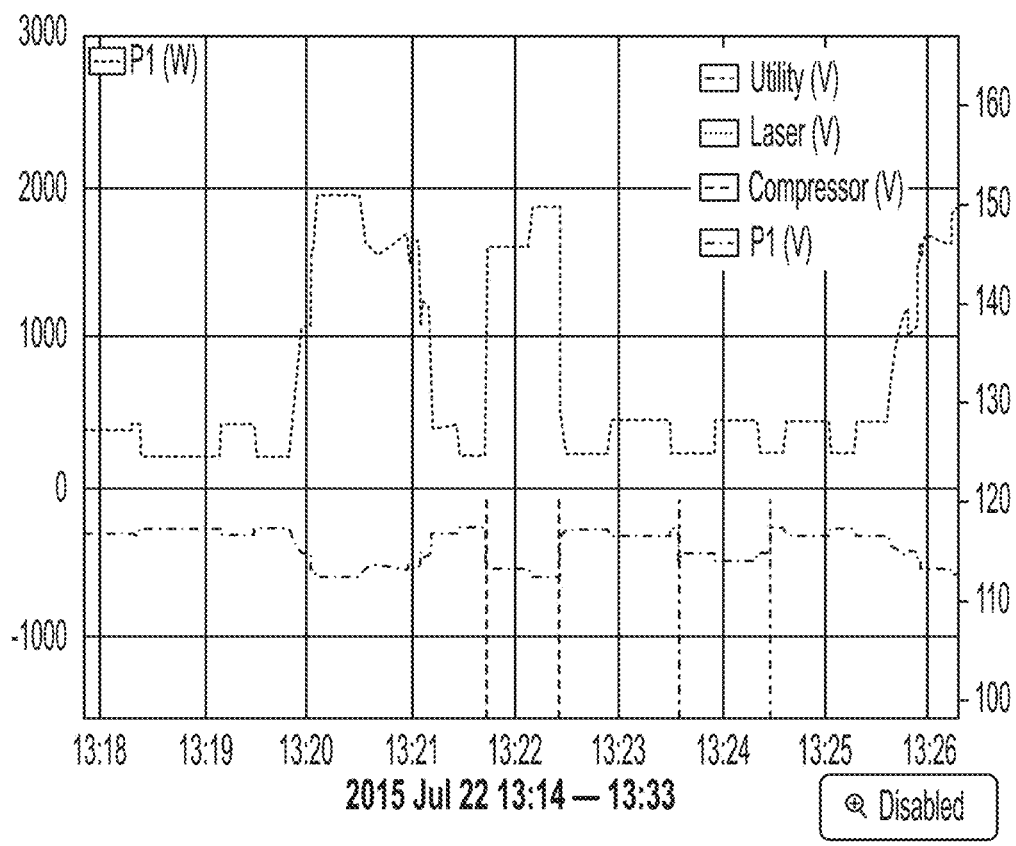
FIG. 30 shows the power waveform as well as the line voltage as measured by the NILM.

In modern machine shops sensitive devices like CNC tools and 3D printers are collocated with other large equipment that can interfere with the line voltage causing droops and harmonics. In this experiment, a 3D printer shares shop space with a laser cutter and an air compressor, both of which introduce power quality problems including voltage sags. Shop preference is to avoid sharp voltage sags of more than two volts during operation of the 3D printer. A NILM monitors the aggregate current and voltage for the entire shop. FIG. 28 shows the power consumption of the shop during normal operation. A cross correlator is trained to identify these loads. The turn-on and turn-off events may be indicated by colored bars. Here, four transients are identified corresponding to a run of the laser cutter and air compressor respectively. As illustrated in FIG. 29, the lower power cycling waveform is the PWM bed heater of the 3D printer. Energy apps on the NILM can both quantify the shop's power quality and improve the power quality to the 3D printer during operation by ensuring proper scheduling of the loads. Over this time interval the NILM detected voltage disturbances large enough to interfere with the 3D printer's operation. FIG. 30 shows the power waveform as well as the line voltage as measured by the NILM. The app outlined in Listing 5 identifies voltage transients larger than 2V.

Listing 5: Energy App psuedo code for identifying and assigning responsibility for voltage transients.

```
1   def run(data, state, insert): #psuedo-code
2       for dv in diff(volts):
3           if(abs(dv)>2): #Voltage transient > 2V
4               eqp = find_equipment_transient(dv)
5               if(eqp= =None): #no equipment turn-on/off
6                   insert("utility")
7               else
8                   insert(eqp.name)
```

When such a transient occurs the app checks the machine events identified by the cross correlator to determine which piece of equipment caused the transient. If no events occurred at the time of the transient, the voltage disturbance is due to an external load not monitored by the NILM. The bars on FIG. 30 indicate voltage transients and the colors assign responsibility either a piece of equipment in the machine shop or to the utility in the case of external loads. While the laser cutter does create a large voltage droop it does so gradually and so does not disturb the printer. The air compressor has much more rapid transients and is identified as an interfering load by the app. There is also a voltage transient that cannot be associated with machines in the shop and the app assigns the transient to the "utility". In fact this transient was due to a nearby shop vac that, while not physically located in the machine shop, did cause voltage disturbances on the line. This type of disturbance is typical of power quality problems induced by operations "outside" of the facility. The NILM, configured as an energy box, is not only capable of controlling load sequencing within a facility, it is also able to recognize internal versus external power quality offenders.

C. Adding Control to an Energy App

Figure 31:
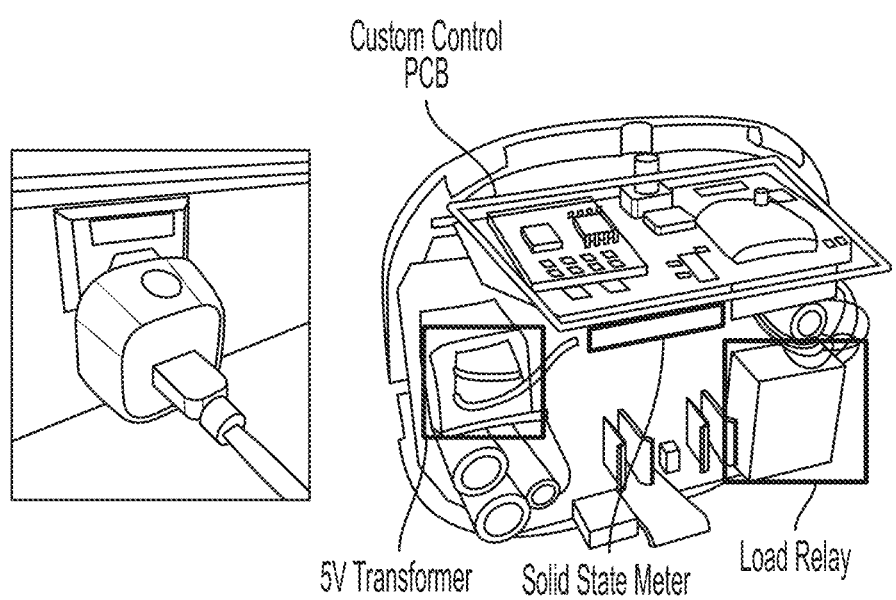
FIG. 31 shows an example of a plug in apparatus that can control a load.

As desired, energy apps can also control loads directly using smart plugs. Smart plugs connect to a WiFi network and allow remote clients to control an embedded relay to switch a load on or off. These plugs are available from a variety of vendors but use proprietary protocols that make them difficult to use outside of their private commercial ecosystem. The plug in FIG. 31 is a modified Belkin WeMo Insight. The stock Insight only communicates with a smart phone app and provides limited metering capability. We designed a drop in replacement control PCB that provides the stock functionality as well as persistent storage to an SD Card, a battery backed real time clock, and high bandwidth metering. This plug interfaces directly with the NILM so energy apps can monitor and control individual loads. The app outlined in Listing 6 uses one of these smart plugs attached to the air compressor to improve the power quality to the 3D printer.

Listing 6: Energy app psuedo code that only allows the air compressor to run when the 3-D printer is off. The app identifies the 3-D printer by the bed heater waveform and only enables the smart plug relay for the air compressor with the bed has been off WAIT_TIME or longer.

```
1   def run(data, state, insert):   #pseudo-code
2       if(detect_printer(data)):
3           #printer is running: disable the compressor
4           set_compressor_relay(OFF)
5           last_run = cur_time
6       elif(cur_time-last_run > WAIT_TIME):
7           #printer has been off at least WAIT_TIME:
8           #  enable the compressor
9           set_compressor_relay(ON)
```

Figure 32:
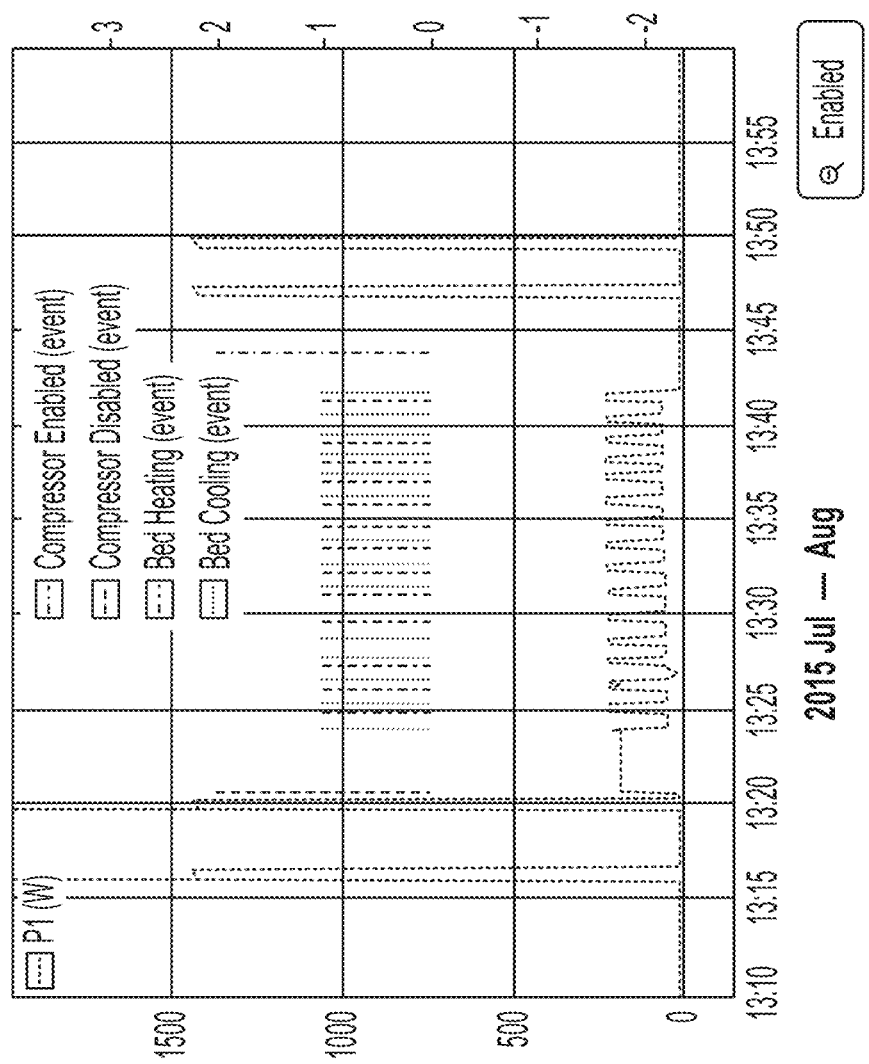
FIG. 32 shows the Power Quality App in action.

FIG. 32 shows the Power Quality App in action: running the code in Listing 6 protects the 30 printer by disabling the air compressor during print jobs. When the 3D printer turns on (as detected by the cross correlator), the app turns the air compressor off. When the printer has been inactive for at least WAIT_TIME seconds, the compressor is turned back on. The actual compressor runs are determined by a pressure gauge on the machine itself.

VI. Conclusion

Detailed energy monitoring and control need not place significant demands on information communication network. High performance computing makes local analysis, reporting, and reconfiguration inexpensive and precise. Nonintrusive monitoring can provide great capabilities to both utilities and consumers as a mechanism to better understand and control energy consumption; their use and application is no longer limited by the difficulty of viewing and processing their large datasets. NILM Manager provides a practical solution for deploying these systems in real world operating environments. The servers described in this section have been in operation for over a year managing energy monitors across the state of Massachusetts, and as far away as Louisiana. Future work includes scaling the network to support more NILM's, optimizing the data processing framework to run on resource constrained embedded systems, and increasing the privacy and security safeguards which distinguish NILM's from the current smart meter network. NilmDB has been used to integrate consumption data from other utilities like water, and other diagnostic sources like vibration meters, to provide a comprehensive view of facility operation using NILM Manager from anywhere in the world. New service opportunities can exploit the NILM Manager platform to provide "energy apps" and an "apps market" that grows to satisfy traditional and new demands for resource analytics.

Additional Aspects

Figure 33:
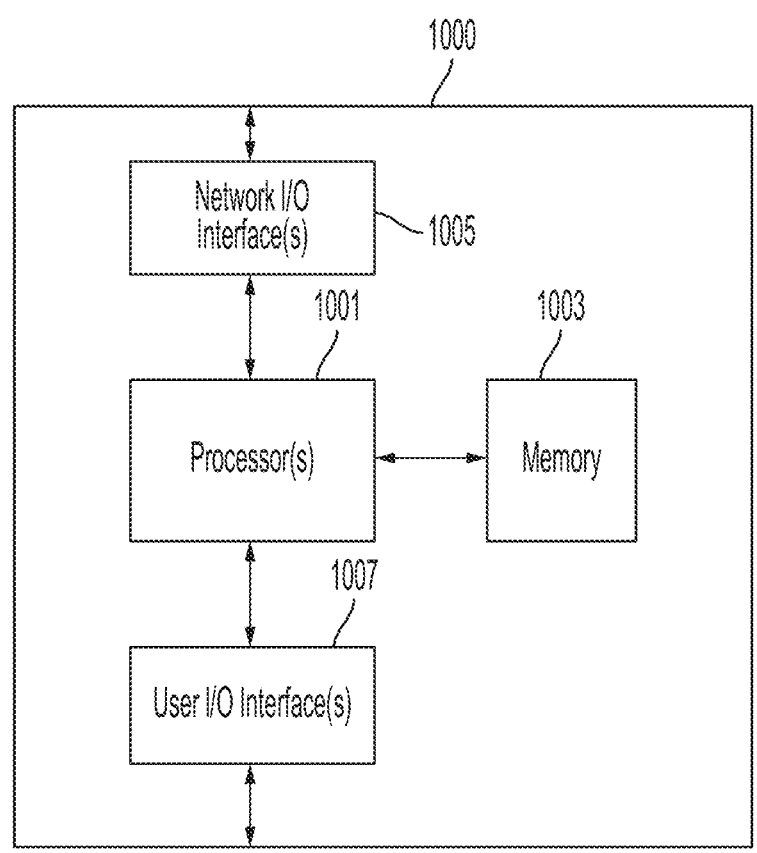
FIG. 33 shows an exemplary computing device.

In some embodiments, techniques described herein, including the above described algorithms, may be carried out using one or more computing devices. Embodiments are not limited to operating with any particular type of computing device. Sensor circuitry or a processor as described herein may be configured to perform A/D conversion and/or other processing of signals from FIG. 33 is a block diagram of an illustrative computing device 1000 that may be used to implement any of the above-described techniques. Computing device 1000 may include one or more processors 1001 and one or more tangible, non-transitory computer-readable storage media (e.g., memory 1003). Memory 1003 may store, in a tangible non-transitory computer-recordable medium, computer program instructions that, when executed, implement any of the above-described functionality. Processor(s) 1001 may be coupled to memory 1003 and may execute such computer program instructions to cause the functionality to be realized and performed.

Computing device 1000 may also include a network input/output (I/O) interface 1005 via which the computing device may communicate with other computing devices (e.g., over a network), and may also include one or more user I/O interfaces 1007, via which the computing device may provide output to and receive input from a user. The user I/O interfaces may include devices such as a keyboard, a mouse, a microphone, a display device (e.g., a monitor or touch screen), speakers, a camera, and/or various other types of I/O devices.

The above-described embodiments can be implemented in any of numerous ways. For example, the embodiments may be implemented using hardware, software or a combination thereof. When implemented in software, the software code can be executed on any suitable processor (e.g., a microprocessor) or collection of processors, whether provided in a single computing device or distributed among multiple computing devices. It should be appreciated that any component or collection of components that perform the functions described above can be generically considered as one or more controllers that control the above-discussed functions. The one or more controllers can be implemented in numerous ways, such as with dedicated hardware, or with general purpose hardware (e.g., one or more processors) that is programmed using microcode or software to perform the functions recited above.

In this respect, it should be appreciated that one implementation of the embodiments described herein comprises at least one computer-readable storage medium (e.g., RAM, ROM, EEPROM, flash memory or other memory technology, CD-ROM, digital versatile disks (DVD) or other optical disk storage, magnetic cassettes, magnetic tape, magnetic disk storage or other magnetic storage devices, or other tangible, non-transitory computer-readable storage medium) encoded with a computer program (i.e., a plurality of executable instructions) that, when executed on one or more processors, performs the above-discussed functions of one or more embodiments. The computer-readable medium may be transportable such that the program stored thereon can be loaded onto any computing device to implement aspects of the techniques discussed herein. In addition, it should be appreciated that the reference to a computer program which, when executed, performs any of the above-discussed functions, is not limited to an application program running on a host computer. Rather, the terms computer program and software are used herein in a generic sense to reference any type of computer code (e.g., application software, firmware, microcode, or any other form of computer instruction) that can be employed to program one or more processors to implement aspects of the techniques discussed herein.

Various aspects of the apparatus and techniques described herein may be used alone, in combination, or in a variety of arrangements not specifically discussed in the embodiments described in the foregoing description and is therefore not limited in its application to the details and arrangement of components set forth in the foregoing description or illustrated in the drawings. For example, aspects described in one embodiment may be combined in any manner with aspects described in other embodiments.

Use of ordinal terms such as "first," "second," "third," etc., in the claims to modify a claim element does not by itself connote any priority, precedence, or order of one claim element over another or the temporal order in which acts of a method are performed, but are used merely as labels to distinguish one claim element having a certain name from another element having a same name (but for use of the ordinal term) to distinguish the claim elements.

Also, the phraseology and terminology used herein is for the purpose of description and should not be regarded as limiting. The use of "including," "comprising," or "having," "containing," "involving," and variations thereof herein, is meant to encompass the items listed thereafter and equivalents thereof as well as additional items.

What is claimed is:

1. An apparatus for non-intrusive power monitoring, the apparatus comprising:
    a capacitive pickup including a plurality of stacked plates, the plurality of stacked plates including a first plate and a second plate stacked such that the second plate is between the first plate and a monitored conductor;
    circuitry for sensing a signal from the capacitive pickup;
    an analog to digital converter to digitize the signal; and
    a digital filter configured to integrate the digitized signal into a voltage measurement while rejecting low-frequency disturbances,
    wherein the digital filter is a Type 3 finite impulse response (FIR) filter.

2. The apparatus of claim 1, wherein the digital filter is configured to reject low-frequency disturbances caused by thermal drift.

3. The apparatus of claim 1, wherein the digital filter has a frequency response that is inversely proportional to frequency.

4. The apparatus of claim 1, wherein the digital filter introduces a phase lag of 90° at a frequency of the voltage measurement.

5. The apparatus of claim 1, wherein the digital filter has zero group delay, introduces 90° of phase lag, and does not pass signals at zero frequency.

6. The apparatus of claim 1, wherein the apparatus comprises a non-intrusive load monitoring apparatus coupled to the capacitive pickup, the non-intrusive load monitoring apparatus comprising:
    at least one processor; and
    at least one memory configured to record measurements with data resolution of at least 1 kHz, the at least one memory storing a plurality of energy monitoring applications comprising instructions, which, when executed by the at least one processor, control one or more loads, and analyze the measurements to produce a report,
    wherein the non-intrusive load monitoring apparatus is configured to transmit the report over an external network and does not transmit the measurements over an external network.

7. The apparatus of claim 1, wherein the signal from the capacitive pickup is a current signal.

8. A method of non-intrusive power monitoring, the method comprising:
    sensing a signal from a capacitive pickup, the capacitive pickup including a plurality of stacked plates, the plurality of stacked plates including a first plate and a second plate stacked such that the second plate is between the first plate and a monitored conductor;
    digitizing the signal; and
    digitally filtering the digitized signal using a Type 3 finite impulse response (FIR) filter to integrate the digitized signal into a voltage measurement while rejecting low-frequency disturbances.

9. The method of claim 8, wherein the digitally filtering of the digitized signal rejects low-frequency disturbances caused by thermal drift.

10. The method of claim 8, wherein the digitally filtering of the digitized signal is performed using a digital filter having a frequency response that is inversely proportional to frequency.

11. The method of claim 8, wherein the digitally filtering of the digitized signal is performed using a digital filter that introduces a phase lag of 90° at a frequency of the voltage measurement.

12. The method of claim 8, wherein the digitally filtering of the digitized signal is performed using a digital filter that has zero group delay, introduces 90° of phase lag, and does not pass signals at zero frequency.

13. The method of claim 8, wherein the signal from the capacitive pickup is a current signal.

* * * * *